US012662721B2

(12) United States Patent
Chen

(10) Patent No.: US 12,662,721 B2
(45) Date of Patent: Jun. 23, 2026

(54) METHOD FOR PREPARING HIGH-FLATNESS METAL FOIL SUITABLE FOR MAKING METAL MASK

(71) Applicant: Magic Star Technology(Ningbo)Co., Ltd., Ningbo (CN)

(72) Inventor: Dinguo Chen, Ningbo (CN)

(73) Assignee: Magic Star Technology(Ningbo)Co., Ltd., Ningbo (CN)

( * ) Notice: Subject to any disclaimer, the term of this patent is extended or adjusted under 35 U.S.C. 154(b) by 875 days.

(21) Appl. No.: 17/950,144

(22) Filed: Sep. 22, 2022

(65) Prior Publication Data

US 2023/0017083 A1     Jan. 19, 2023

(30) Foreign Application Priority Data

Sep. 22, 2021   (CN) ........................... 202111108320.5
Feb. 11, 2022   (CN) ......................... 202210129423.8
Mar. 2, 2022    (CN) ......................... 202210196923.3

(51) Int. Cl.

| | |
|---|---|
| *C21D 9/46* | (2006.01) |
| *B21B 1/40* | (2006.01) |
| *B23K 26/354* | (2014.01) |
| *C21D 6/00* | (2006.01) |
| *C21D 8/02* | (2026.01) |
| *C21D 8/0221* | (2026.01) |
| *C22C 19/07* | (2006.01) |
| *C22C 38/08* | (2006.01) |
| *C22C 38/10* | (2006.01) |

(Continued)

(52) U.S. Cl.
CPC ................ *C22C 19/07* (2013.01); *B21B 1/40* (2013.01); *B23K 26/354* (2015.10); *C21D 6/001* (2013.01); *C21D 6/007* (2013.01);

*C21D 8/02* (2013.01); *C21D 8/0226* (2013.01); *C21D 8/0236* (2013.01); *C21D 9/46* (2013.01); *C22C 38/08* (2013.01); *C22C 38/105* (2013.01); *C22F 1/10* (2013.01); *C25D 1/04* (2013.01); *C25D 1/20* (2013.01); *C23C 14/042* (2013.01)

(58) Field of Classification Search
None
See application file for complete search history.

(56) References Cited

U.S. PATENT DOCUMENTS

| | | |
|---|---|---|
| 2010/0059145 A1 | 3/2010 | Hattendorf et al. |
| 2012/0034484 A1 | 2/2012 | Behrens |
| 2015/0013600 A1 | 1/2015 | Hsu et al. |

FOREIGN PATENT DOCUMENTS

JP            2021014639 A  *  2/2021

* cited by examiner

*Primary Examiner* — Anthony M Liang

(57) ABSTRACT

Disclosed is a method for preparing a high-flatness metal foil suitable for making a metal mask, and the method comprises the following steps: forming a raw metal coarse foil; rolling the raw metal coarse foil at least once into a high-flatness metal foil; performing, by a heat treatment device, heat treatment processing on the precisely rolled metal foil according to a preset temperature and a preset time; using a tension leveler to perform tension leveling on the rolled and heat-treated metal foil; and obtaining a high-flatness metal foil after completion of the tension leveling and forming a rolled metal foil in a continuous forming process. The resulting metal foil has high flatness and low residual stress, which improves quality and performance of the metal foil and is suitable for the fabrication of fine metal masks.

11 Claims, 20 Drawing Sheets

(51) Int. Cl.

| | | |
|---|---|---|
| *C22F 1/10* | (2006.01) | |
| *C25D 1/04* | (2006.01) | |
| *C25D 1/20* | (2006.01) | |
| *C23C 14/04* | (2006.01) | |

S1014 — Metal melting

S1015 — Refining

S1016 — Hot forging

S1017 — Hot rolling

S1018 — First heat treatment

S1019 — Cold rolling

Repeat

S1020 — Second heat treatment

S102 — Precision rolling

S103 — Final heat treatment

Repeat

S104 — Tension leveling

S105 — Forming a high-flatness metal foil

Metal powder laser processing and melting example: invar alloy

| Metal foil number | Region | Metal foil flatness characteristics | | | | | Performance of prepared metal mask strip | | | |
| | | Raised height (maximum) H(mm) | Average flatness (Ave. HSR) | Skirt region (area ratio %) | Central raised region (area ratio %) | Flat region (area ratio %) | Difference of total length TPx (X1-X3) max. | min. | Difference of total width Tpy (max.-min.) max. | min. |
|---|---|---|---|---|---|---|---|---|---|---|
| FIG. 8a | Left | 0.38 | 1.46 | 17.3 | 64.6 | 18.1 | -12.53 | 0.12 | 4.27 | 2.7 |
| | Center | 0.33 | 0.60 | | | | | | | |
| FIG. 8b | Both sides | 0.33 | 1.07 | 27.7 | 0.68 | 71.6 | -4.92 | -17.9 | 2.85 | -3.18 |
| | Center | 0.12 | 0.80 | | | | | | | |
| FIG. 8c | Both sides | 0.65 | 1.40 | 28.3 | 26.0 | 45.7 | -5.29 | -10.39 | 1.34 | 1.12 |
| | Center | 0.23 | 0.6 | | | | | | | |
| FIG. 9d | Both sides | 0.36 | 0.98 | 13.7 | 50.0 | 36.3 | 32.69 | 17.6 | 3.16 | 1.71 |
| | Center | 1.00 | 1.03 | | | | | | | |
| FIG. 9e | Both sides | 0.92 | 1.79 | 30.5 | 38.9 | 30.6 | One side upwards- unable to make | | | |
| | Center | 0.30 | 0.5 | | | | | | | |
| FIG. 9f | Both sides | 1.45 | 1.8 | 45.9 | 27.2 | 27 | 257.7 | 191.4 | 7.87 | 6.4 |
| | Center | 0.48 | 0.8 | | | | | | | |

FIG. 15

| Metal foil number | Volume fraction of grains in main grain direction in metal foil* | | | | |
|---|---|---|---|---|---|
|  | (111) | (200) | (220) | (311) | (222) |
| Invar standard sample | 49.8 | 24.4 | 12.4 | 10.0 | 3.5 |
| Foil 1 | 2.1 | 41.9 | 42.7 | 13.3 | -- |
| Foil 2 | 1.4 | 39.7 | 47.3 | 11.6 | -- |
| Foil 3 | 1.6 | 38.7 | 47.7 | 12.1 | -- |
| Foil 4 | 3.1 | 82.6 | 9.0 | 5.2 | -- |
| Foil 5 | 4.8 | 43.9 | 24.2 | 27.1 | -- |
| Foil 6 | 0.5 | 36.6 | 51.4 | 11.5 | -- |
| Foil 7 | 0.3 | 43.9 | 37.7 | 18.2 | -- |
| Foil 8 | 8.2 | 45.5 | 31.8 | 14.1 | 0.4 |
| Foil 9 | 0.8 | 36.0 | 53.2 | 10.0 | -- |

*: According to intensity of the X-ray diffraction spectrum

FIG. 16

METHOD FOR PREPARING HIGH-FLATNESS METAL FOIL SUITABLE FOR MAKING METAL MASK

TECHNICAL FIELD

The disclosure pertains to the technical field of fine metal mask (FMM) preparation, and specifically pertains to a method for preparing a high-flatness metal foil suitable for preparing a metal mask.

BACKGROUND

Organic light emitting diode (OLED) has the advantages of light weight, wide viewing angle, fast response time, low temperature resistance and high luminous efficiency compared with liquid crystal displays, and is regarded as the next generation of new display technology. Generally, an organic electroluminescent thin film device is prepared by a vacuum evaporation deposition technique, that is, heating an organic semiconductor material in a vacuum environment, heating and sublimating the material, forming an organic thin film device stack with a designed shape on a surface of a substrate through a metal mask with a special subpixel pattern, undergoing continuous deposition of a plurality of materials to form a film, and plating an anode and a cathode on each end of the stack to form an OLED light emitting device structure with a multi-layer thin film; and a key component in the manufacture of the OLED light emitting device is a fine metal mask (FMM) made of a high-flatness metal foil.

An ultra-thin metal sheet, typically an iron-nickel alloy, made by multi-stage conventional hot rolling, heat treatment, cold rolling to the required thickness and heat treatment, has a thickness of between 20 and 100 m. The metal sheet undergoes semiconductor photolithography and wet etching to form numerous micropore patterns in the ultra-thin metal sheet, corresponding to the design of an OLED light emitting device for a light emitting subpixel in a desired AMOLED display. Many impurities and contaminants are generated and contained in the material in the process steps of melting and multiple hot rolling, heat treatment, cold rolling and heat treatment, resulting in problems and yield loss in fine mask fabrication. Therefore, this method is limited by cleanliness of raw materials used and quality, thickness and etching accuracy of the metal foil made by the final multiple rolling process, which can reach a resolution of about 400-600 ppi at present. Making of the metal foil requires a lot of apparatus investment, and the making procedure and process are long and costly, but the making yield is often not high, and the yield of the thin ($\leq 0.1$ mm) metal foil with high flatness is less than 40%. At the same time, the flatness or residual stress of the metal foil manufactured by other non-optimized methods is not ideal, resulting in yield loss; therefore, such metal foil is not suitable for the making of the FMM.

SUMMARY

An object of the disclosure is to design a method for preparing a high-flatness metal foil suitable for making a metal mask in the following manner in order to solve the above-mentioned technical disadvantages.

A method for preparing a high-flatness metal foil suitable for making a metal mask designed by the disclosure comprises the following steps:

S101, forming a raw metal coarse foil, wherein a material of the formed metal coarse foil is one of invar alloy, iron-nickel alloy, iron-nickel-manganese alloy, iron-nickel-cobalt alloy and iron-cobalt-chromium alloy;

S102, precision rolling: rolling the raw metal coarse foil at least once into a high-flatness metal foil with a required precision thickness and a flat surface, wherein the high-flatness metal foil manufactured and formed after precision rolling is 5 μm to 5 mm;

S103, final heat treatment: performing, by a heat treatment device, heat treatment at least once on the metal foil experiencing the precision rolling according to a preset temperature and a preset time;

S104, tension leveling: performing tension leveling at least once on the metal foil experiencing the rolling and the heat treatment using a tension leveler; and S105, obtaining a high-flatness metal foil after completion of the tension leveling, and forming a rolled metal foil in a continuous forming process.

Preferably, the invar alloy has a mass percentage composition of 35-39 wt. % Ni, with the balance being Fe and inevitable impurities; the iron-nickel alloy has a mass percentage composition of 42-46 wt. % Ni, with the balance being Fe and other trace elements; the iron-nickel-cobalt alloy has a mass percentage composition of 31-39 wt. % Ni and 0.02-6 wt. % Co, with the balance being Fe and other trace elements; the iron-nickel-manganese alloy has a mass percentage composition of 35-37 wt. % Ni, with total amount of Mn, Si and Cr being 0.001-1 wt. %, and the balance being Fe and other trace elements; and the iron-cobalt-chromium alloy has a mass percentage composition of 52-54 wt. % Co and 9-10 wt. % Cr, with the balance being Fe and other trace elements.

Preferably, in step S104, when the tension leveling is performed, the tension leveler applies a tension in the range of 3-30 kgf/mm$^2$, and the obtained metal foil is subjected to residual stress relief treatment under an atmosphere with a dry reducing gas and oxygen content below 100 ppm, or under a reducing atmosphere, or under a vacuum environment, at a temperature of 105±50° C. for 2-60 minutes.

Preferably, in step S101, the raw metal coarse foil is formed by a method comprising the following steps:

S1011, metal powder packing: packing clean metal powder experiencing particle size screening into a metal powder dispenser of a laser melting processing apparatus;

S1012, metal coarse foil forming: uniformly injecting, by the metal powder dispenser, the metal powder onto a substrate on a working platform in the laser melting processing apparatus to form a metal powder layer, and then welding, by a laser plane scanner in the laser melting processing apparatus, the metal powder layer into a metal coarse foil; and S1013, primary heat treatment: performing, by the heat treatment device, heat treatment at least once on the metal coarse foil according to a preset temperature and a preset time to form the raw metal coarse foil, and then proceeding to step S102.

Preferably, in step S1013, the primary heat treatment is selected from at least one of annealing, stress relief and material stabilizing aging treatment, the heat treatment atmosphere is selected from the dry inert atmosphere or the reducing atmosphere or the vacuum environment, the preset temperature ranges from 60±5° C. to 1050±25° C., and the preset time is 2 seconds to 5 hours. In step S103, the final heat treatment is selected from at least one of annealing, stress relief and material stabilizing aging treatment, the heat treatment atmosphere is selected from the dry inert atmosphere or the reducing atmosphere or the vacuum environment, the preset temperature ranges from 60±5° C. to 1050±25° C., and the preset time is 2 seconds to 5 hours.

Preferably, the method further comprises a metal powder forming step which comprises the following steps:

S99, metal melting: melting selected high-purity metal materials in a vacuum melting manner so that the metals become a molten state; and S100, making metal powder: atomizing, cooling and solidifying the metals in the molten state to form fine clean metal powder.

Preferably, in step S99, a number of pure metal raw materials with a purity more than 99% and an oxygen content less than 2000 ppm or an oxygen content less than 200 ppm are selected and put into a vacuum melting furnace for melting after composition proportioning at a temperature ranging from 350° C. to 1700° C., a vacuum degree ranging from 0.01 to $10^4$ Pa or from $10^{-4}$ to 100 mbar, and a melting power of 200 to 1200 KW.

Preferably, in step S101, the raw metal coarse foil is formed by a method comprising the following steps:

S1014, metal melting: sorting and cleaning metal raw materials obtained from rough melting or recovered metal materials, then proportioning and adjusting the metal raw materials according to components of an alloy to be melted, adding a reducing agent and the like to perform metal melting, and pouring a resulting molten metal into a casting mold to solidify the metal into an ingot;

S1015, refining: refining the ingot to form a metal ingot;

S1016, hot forging: performing high-temperature forging on the refined metal ingot so as to forge a large cylindrical metal ingot into a square metal block;

S1017, hot rolling: performing surface treatment on the hot forged metal block, and performing continuous hot rolling to make the metal block into metal sheets in millimeters to centimeters in thickness;

S1018, primary heat treatment: performing heat treatment at least once on the hot-rolled metal sheets to adjust microstructure and stress;

S1019, cold rolling: performing surface treatment on the metal sheets, removing surface oxide layers and washing the metal sheets, and performing cold rolling treatment at least once on the washed metal sheets; and S1020, secondary heat treatment: performing heat treatment at least once on the cold rolled metal sheets to adjust the microstructure and internal stress so as to form the raw metal coarse foil, and proceeding to step S102.

Preferably, in step S101, the raw metal coarse foil is formed by a method comprising the following steps:

S1021, cleaning a metal substrate: using a chemical cleaning agent to remove residues, contaminants, organic substances and an oxide layer from a surface of a stainless steel substrate, washing the substrate with water after completion of the removal, and further air-drying the metal substrate after the washing with water;

S1022, pretreatment of the metal substrate: soaking the surface of the metal substrate with a high-concentration acid solution, washing with water after completion of the soaking, and further air-drying the metal substrate after the washing with water;

S1023, precision electroforming: connecting the metal substrate to a negative electrode, and then putting the metal substrate into an electroforming tank for electroforming so as to form a metal coarse foil substrate;

S1024, washing the metal coarse foil substrate: washing off an electrolyte on the metal coarse foil substrate formed by the electroforming with water, and air-drying the substrate after completion of the washing;

S1025, primary heat treatment: placing the cleaned metal coarse foil substrate in a heat treatment environment to adjust a crystalline phase microstructure and relieve an internal stress; and S1026, peeling off the metal substrate: after the primary heat treatment, mechanically peeling off the metal coarse foil substrate from the metal substrate to form the raw metal coarse foil, and proceeding to step S102.

Preferably, in step S1025, the primary heat treatment is selected from at least one of annealing, stress relief and material stabilizing aging treatment, the heat treatment atmosphere is selected from the dry inert atmosphere or the reducing atmosphere or the vacuum environment, the preset temperature ranges from 300° C. to 700° C., and the preset time is 2 seconds to 2 hours.

In step S103, the final heat treatment is selected from at least one of annealing, stress relief and material stabilizing aging treatment, the heat treatment atmosphere is selected from the dry inert atmosphere or the reducing atmosphere or the vacuum environment, the preset temperature ranges from 300±5° C. to 775±25° C., and the preset time is 2 seconds to 1 hours.

Preferably, a high-flatness invar alloy metal foil is prepared, and a part of the high-flatness invar alloy metal foil is cut out to perform flatness detection, residual stress detection and crystalline phase structure detection:

the flatness detection shows that an average three-dimensional flatness of the edge waviness region on both sides of the high-flatness invar alloy metal foil is less than 1.5%, and the average three-dimensional flatness of a central region thereof is less than 1%;

the residual stress detection shows that the residual stress of the high-flatness invar metal foil is less than or equal to 200 MPa; and the crystalline phase structure detection shows that a grain direction of a grain structure of the high-flatness invar metal foil is concentrated in three directions (200), (220) and (311), and a volume fraction of grains in the main grain direction in the metal foil is between 5% and 50% respectively.

The disclosure has the following beneficial effects compared with the prior art: the metal foil has high flatness and low residual stress, which improves quality and performance of the metal foil and makes fabrication of the fine metal masks and subsequent AMOLED more reliable.

5

Figures 7, 8:
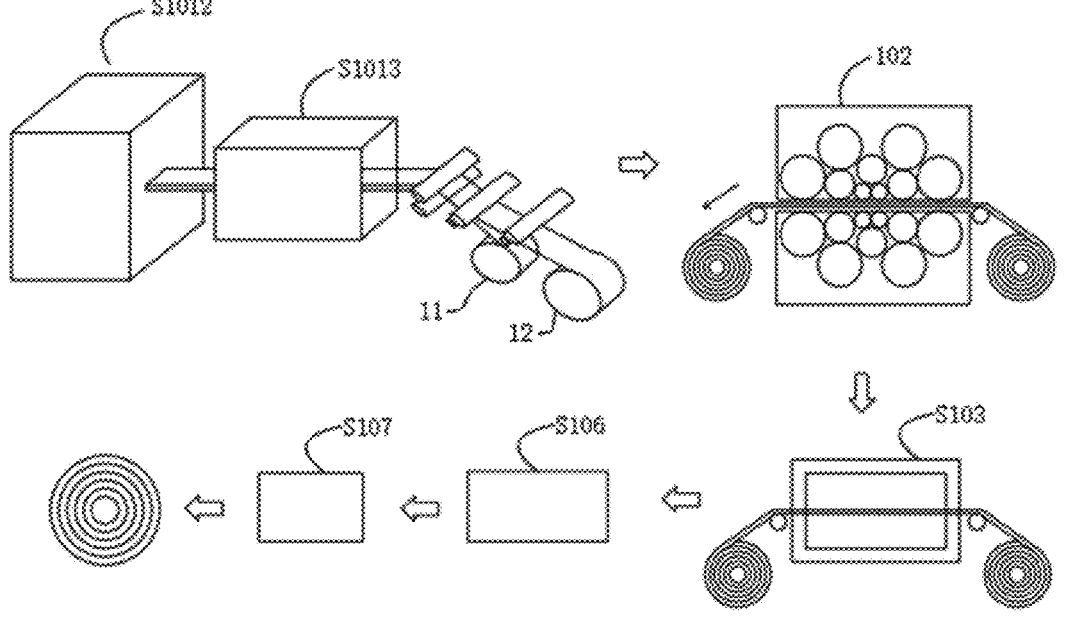
Figure 9:
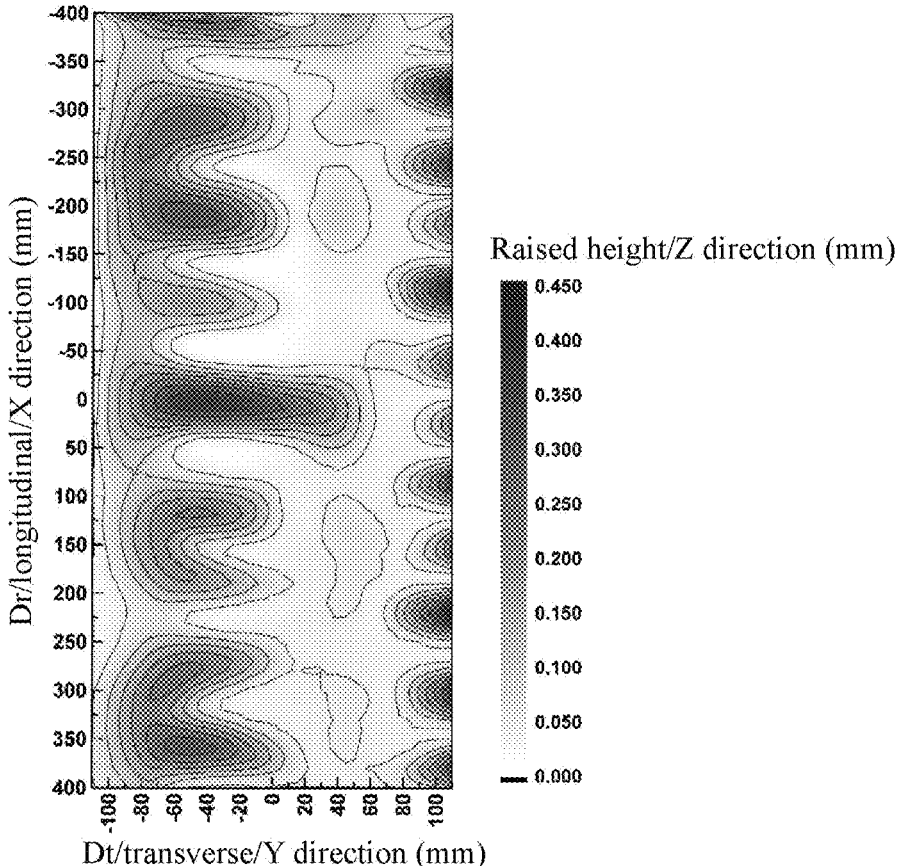
Figure 10:
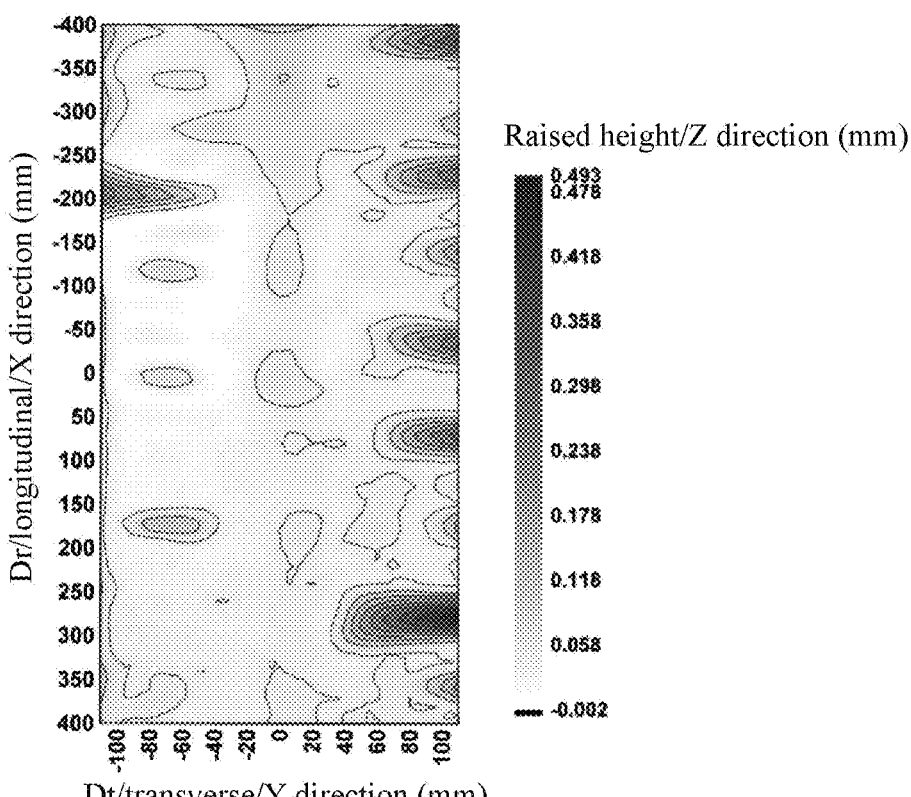
Figure 11:
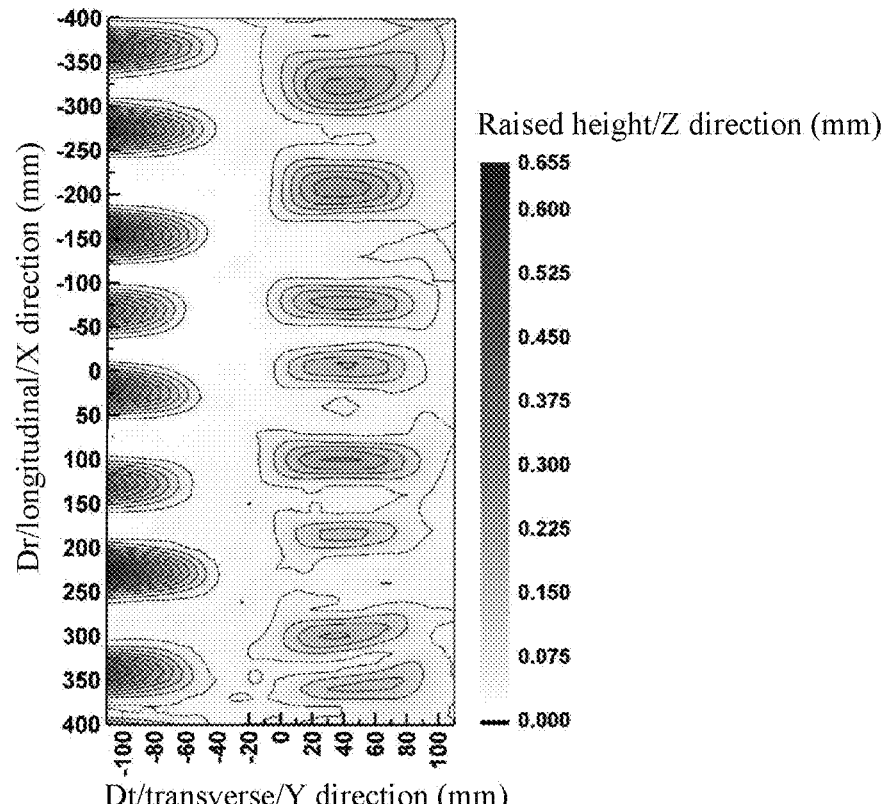
Figure 12:
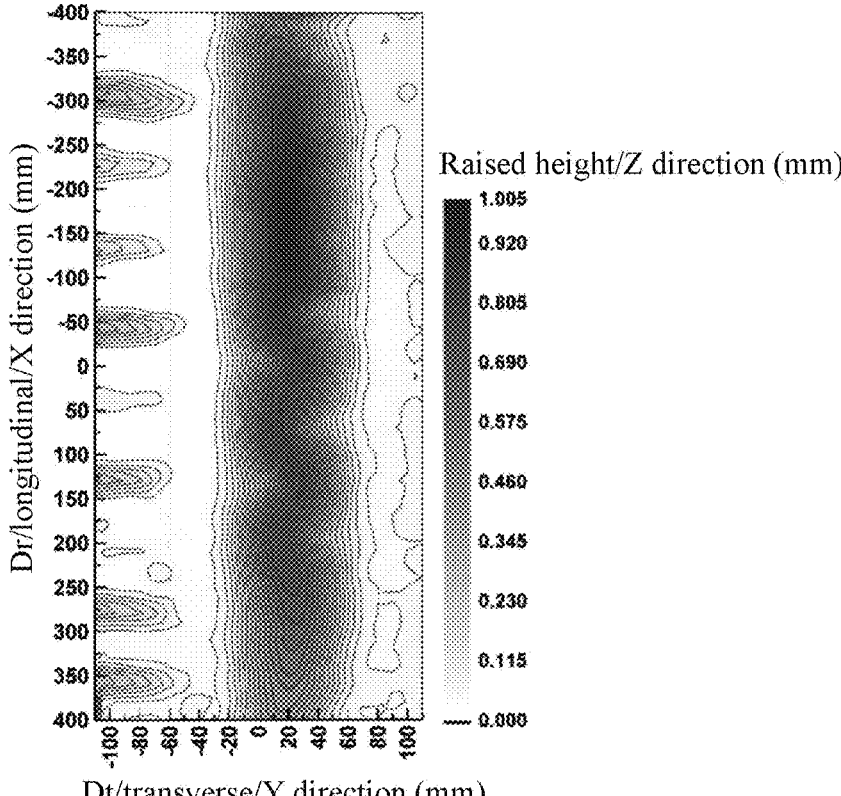
Figure 13:
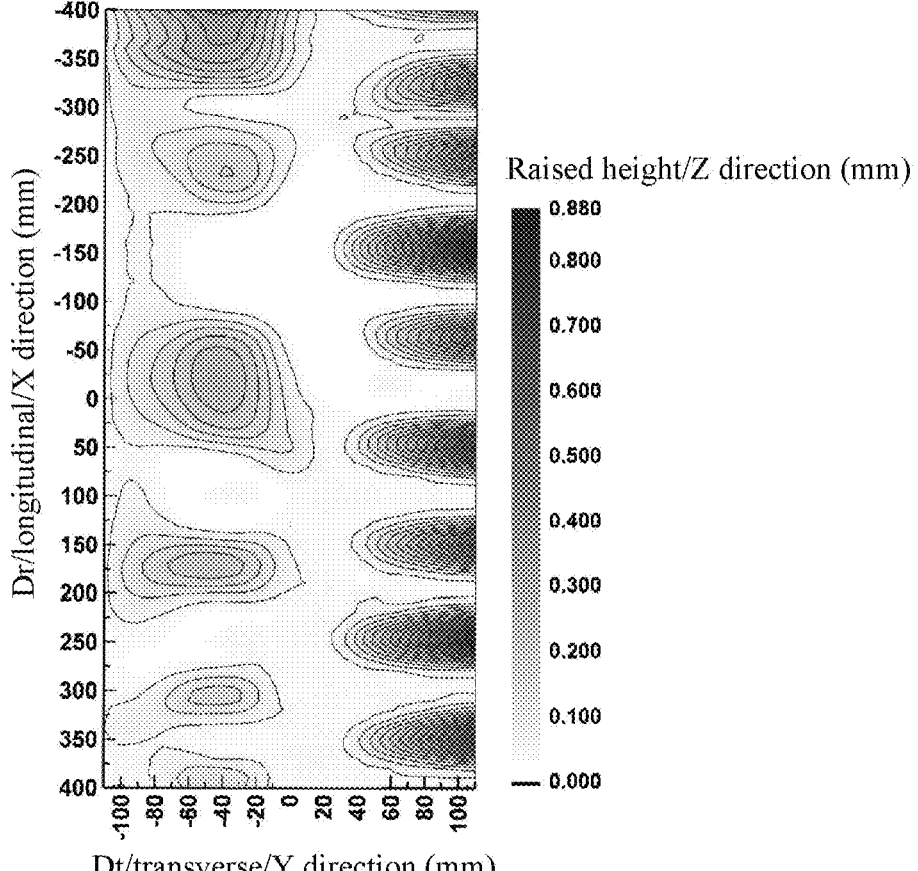
Figure 14:
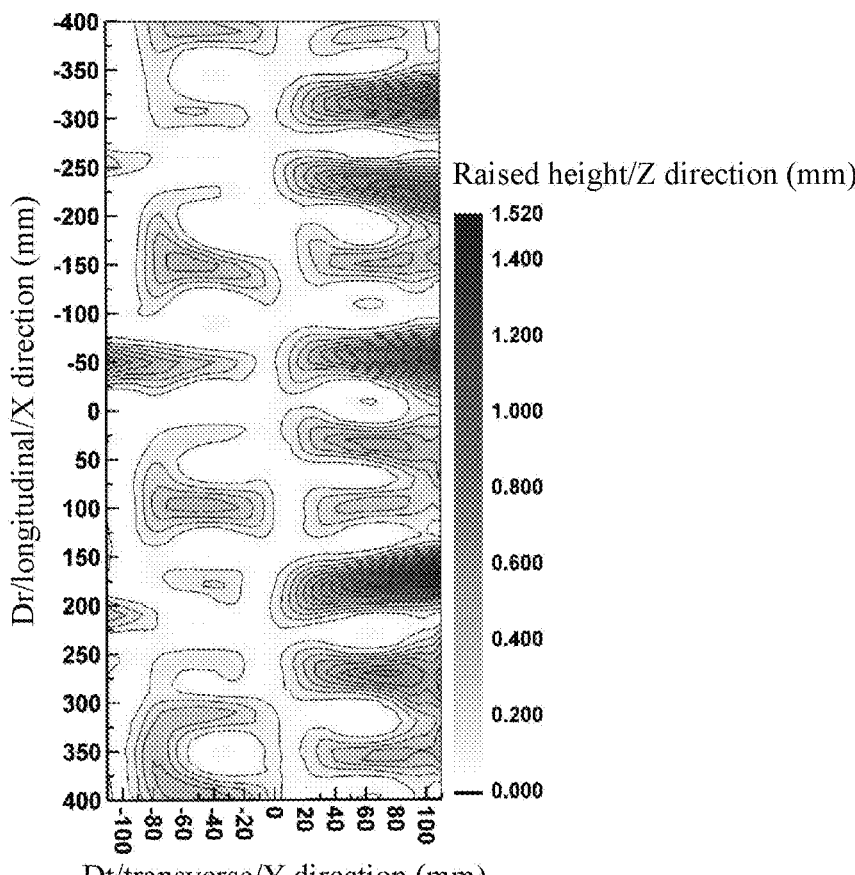
Figure 17:
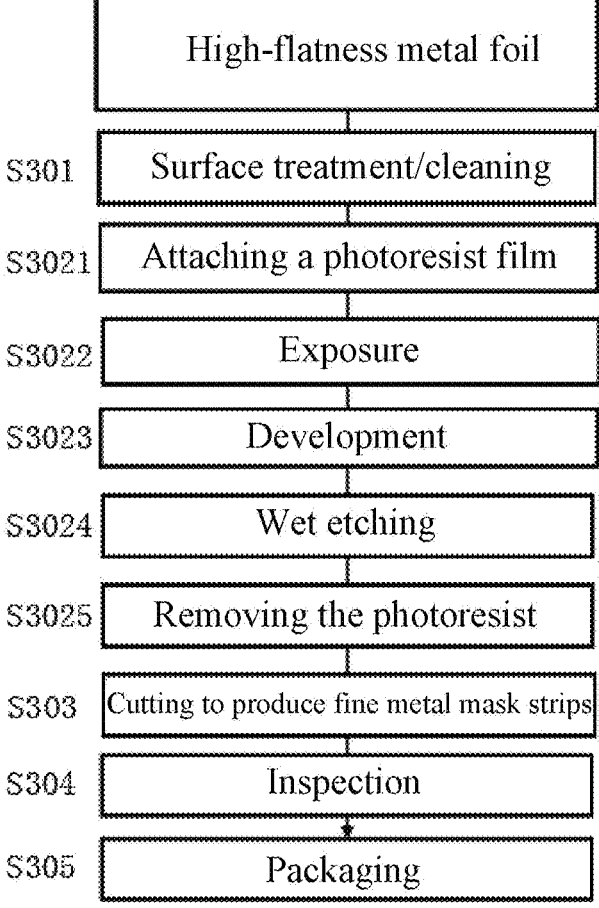
Figure 18:
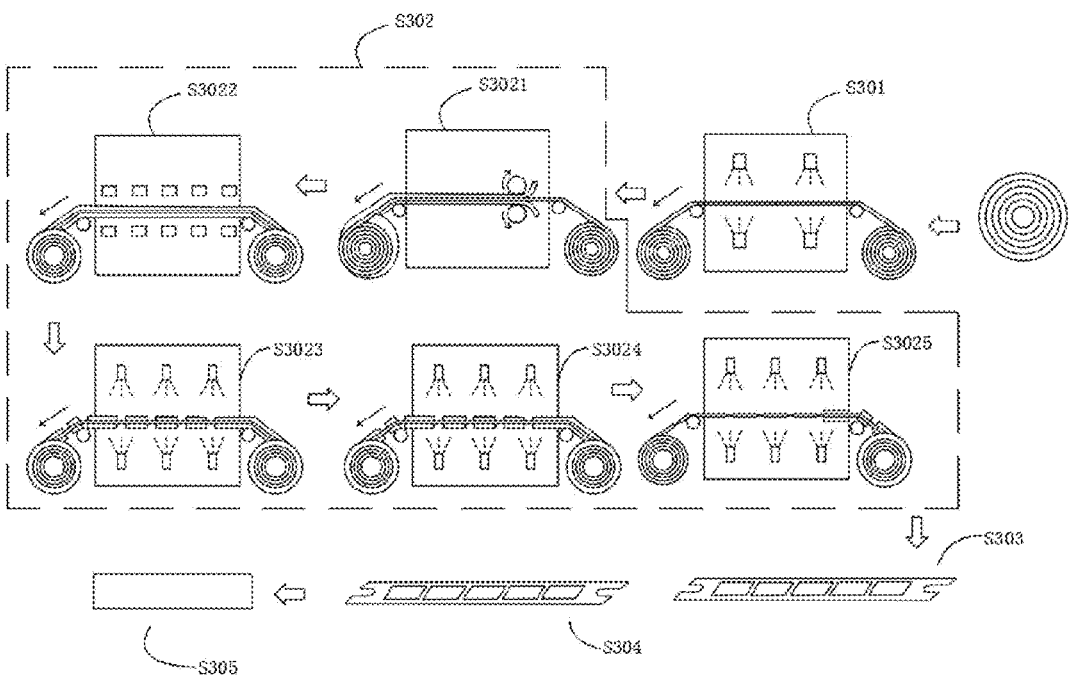
Figure 19:
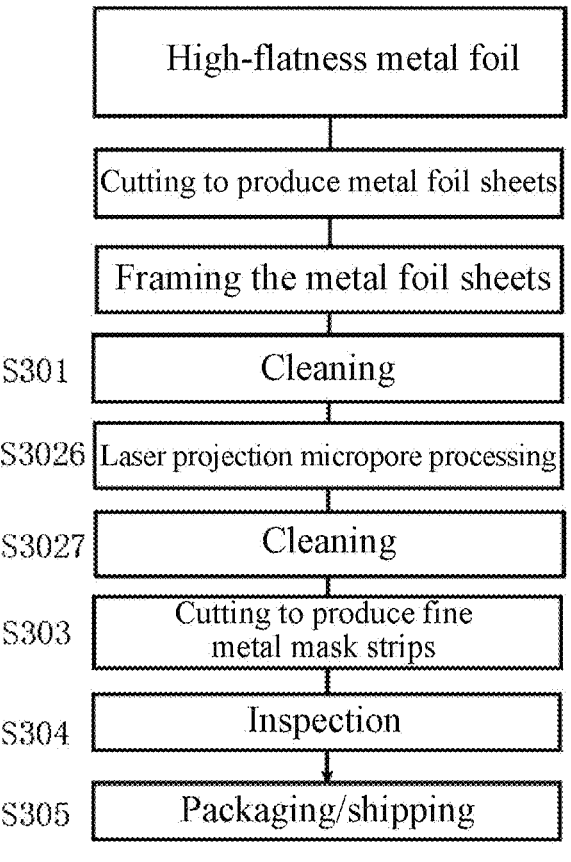
Figure 20:
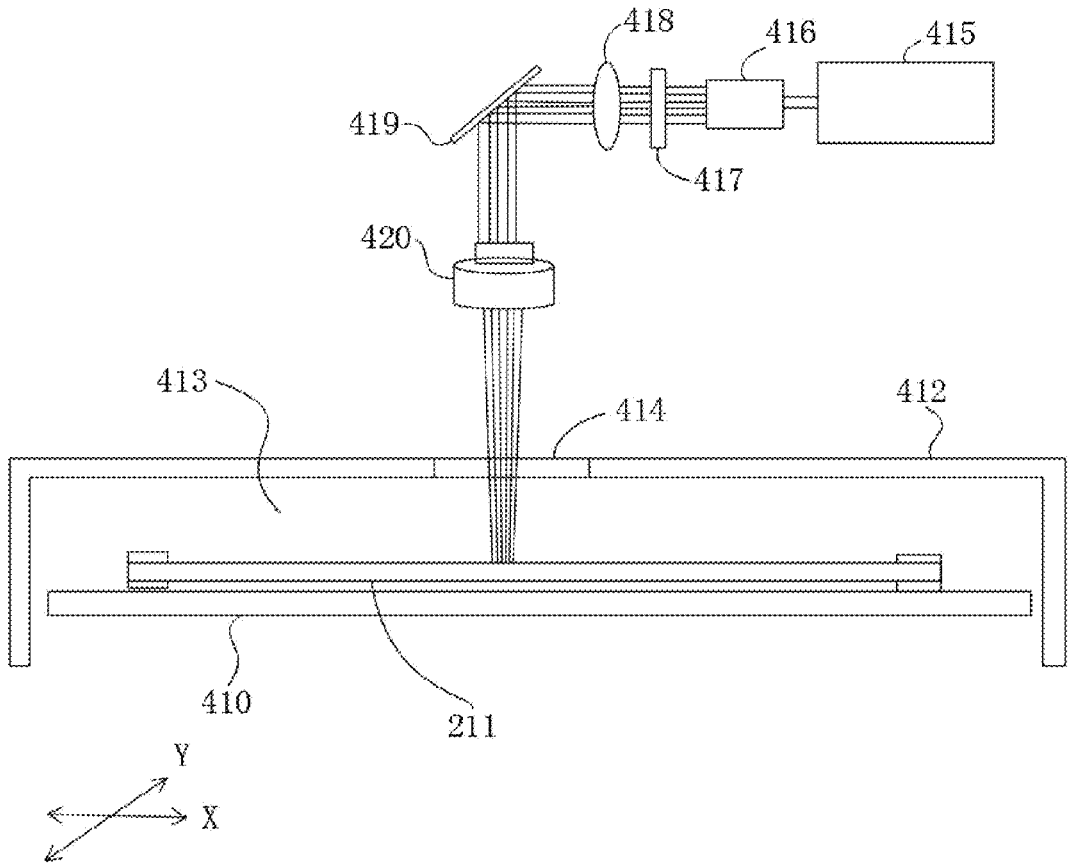
Figure 21:
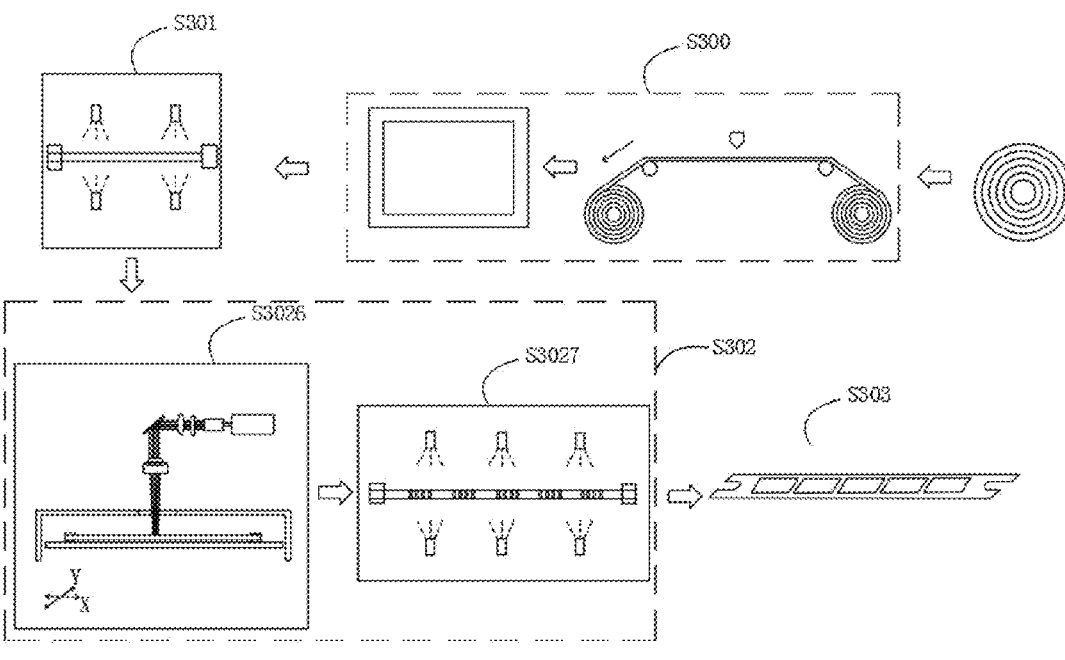

FIG. 7 is a process flow diagram of a continuous laser melting process for making a metal foil;

FIG. 8 is an illustrative example of measurement of a total width and a total width of a screen area of a large-sized high fine metal mask strip;

FIG. 9 is a schematic diagram of a three-dimensional flatness of a metal foil (I);

FIG. 10 is a schematic diagram of the three-dimensional flatness of the metal foil (II);

FIG. 11 is a schematic diagram of the three-dimensional flatness of the metal foil (III);

FIG. 12 is a schematic diagram of the three-dimensional flatness of the metal foil (IV);

FIG. 13 is a schematic diagram of the three-dimensional flatness of the metal foil (V);

FIG. 14 is a schematic diagram of the three-dimensional flatness of the metal foil (VI);

FIG. 15 is a schematic diagram of an average three-dimensional flatness (Hump Size Ratio, HSR) of a high flatness metal foil and characteristics of a fine metal mask strip made therefrom;

FIG. 16 is a schematic diagram of a crystalline phase microstructure characteristic of a high-flatness metal foil;

FIG. 17 is a flow diagram of fabricating a fine metal mask strip (I);

FIG. 18 is a flow diagram of fabricating a roll-to-roll fine metal mask strip (I);

FIG. 19 is a flow diagram of fabricating a fine metal mask strip (II);

FIG. 20 is a structural schematic diagram of an apparatus for laser micro-drilling a metal foil;

FIG. 21 is a schematic diagram of a process for fabricating a fine metal mask strip by sheet laser micro-drilling.

In the drawings, 1. metal powder dispenser, 2. metal powder layer, 3. substrate, 4. working platform, 5. laser, 6. X-Y plane scanning mirror, 7. focusing optical lens group, 8. metal coarse foil, 9. environment, 211. metal foil sheet, 412. processing cavity, 413. ambient atmosphere, 414. optical transmission window, 415. laser, 416. laser beam homogenizer, 417. photomask, 418. lens system, 419. mirror, and 420. projection lens group.

DESCRIPTION OF THE EMBODIMENTS

The technical schemes in examples of the disclosure will be clearly and completely described below in conjunction with the accompanying drawings in the examples of the disclosure. Obviously, the examples described are only part, instead of all, of the examples of the disclosure. Based on the examples in the disclosure, all other examples obtained by a person skilled in the art fall within the scope of protection of the disclosure.

Example 1

Figure 1:
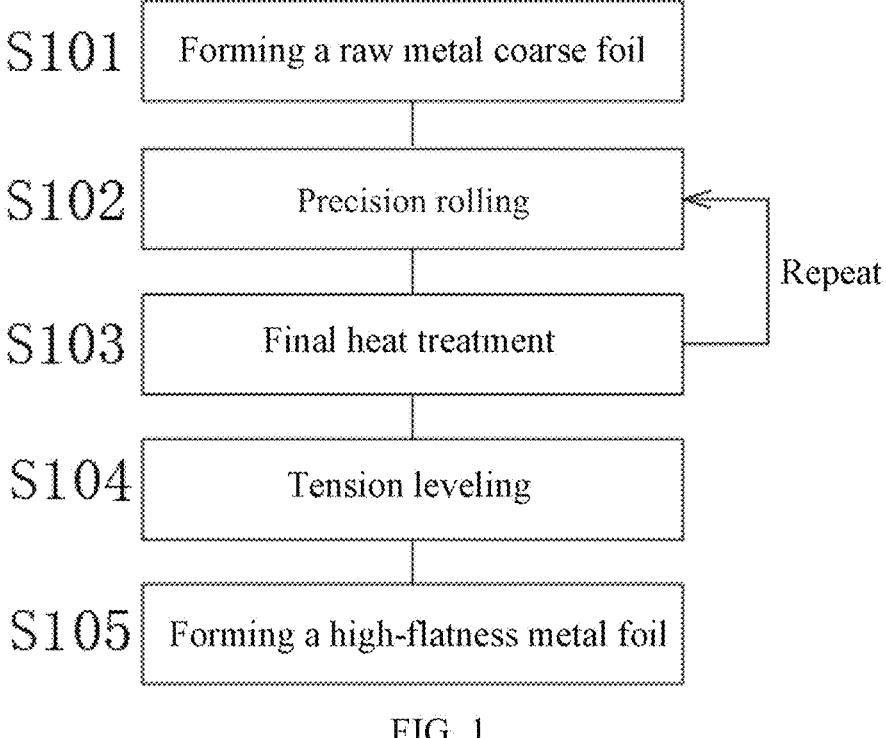
FIG. 1 is a process flow diagram of a high-flatness metal foil (I)

As shown in FIG. 1, the example describes a method for preparing a high-flatness metal foil suitable for making a metal mask, which comprises the following steps:

S101, forming a raw metal coarse foil, wherein a material of the formed metal coarse foil is one of invar alloy, iron-nickel alloy, iron-nickel-manganese alloy, iron-nickel-cobalt alloy and iron-cobalt-chromium alloy;

S102, precision rolling: rolling the raw metal coarse foil at least once into a high-flatness metal foil with a required precision thickness and a flat surface, wherein the high-flatness metal foil manufactured and formed after precision rolling is 5 μm to 5 mm;

S103, final heat treatment: performing, by a heat treatment device, heat treatment at least once on the metal foil experiencing the precision rolling according to a preset temperature and a preset time;

S104, tension leveling: performing tension leveling at least once on the metal foil experiencing the rolling and the heat treatment using a tension leveler, where the metal foil obtained after the tension leveling has a high flatness and a thickness of 15-50 μm, and if a target thickness is very thin or the thickness of an initial coarse metal foil is large, step S102 and step S103 can be repeated several times to prepare the high-flatness metal foil achieving the desired target thickness; and S105, obtaining a high-flatness metal foil after completion of the tension leveling, and forming a rolled metal foil in a continuous forming process.

Preferably, in step S104, when the tension leveling is performed, the tension leveler applies a tension in the range of 3-30 kgf/mm$^2$, and the obtained metal foil is subjected to residual stress relief treatment under an atmosphere with a dry reducing gas and oxygen content below 100 ppm, or under a reducing atmosphere, or under a vacuum environment, at a temperature of 105±50° C. for 2-60 minutes. Where, the reducing atmosphere, such as mixed argon-hydrogen, hydrogen, and an inert atmosphere, should have an oxygen content less than 100 ppm.

The method of this example can be used to make a metal foil with a low thermal expansion coefficient, for example, the method can be used to make the invar alloy which has a mass percentage composition of 35-39 wt. % Ni, with the balance being Fe and inevitable impurities; the iron-nickel alloy which has a mass percentage composition of 42-46 wt. % Ni, with the balance being Fe and other trace elements; the iron-nickel-cobalt alloy which has a mass percentage composition of 31-39 wt. % Ni and 0.02-6 wt. % Co, with the balance being Fe and other trace elements; the iron-nickel-manganese alloy which has a mass percentage composition of 35-37 wt. % Ni, with total amount of Mn, Si and Cr being 0.001-1 wt. %, and the balance being Fe and other trace elements; the iron-cobalt-chromium alloy which has a mass percentage composition of 52-54 wt. % Co and 9-10 wt. % Cr, with the balance being Fe and other trace elements; and other metal foils such as superalloys. The resulting Invar alloy has physical properties, but has relatively high cleanliness, relatively low cost, and relatively short manufacturing period, and is particularly suitable for the fabrication of a metal mask.

In this example, a high-flatness invar alloy metal foil is prepared, and a part of the high-flatness invar alloy metal foil is cut out to perform flatness detection, residual stress detection and crystalline phase structure detection:

the flatness detection shows that an average three-dimensional flatness (HSR) of the edge waviness region on both sides of the high-flatness invar alloy metal foil is less than 1.5%, and the average three-dimensional flatness (HSR) of a central region thereof is less than 1%;

the residual stress detection shows that the residual stress of the high-flatness invar metal foil is less than or equal to 200 MPa; and the crystalline phase structure detection shows that a grain direction of a grain structure of the high-flatness invar metal foil is concentrated in three directions (200), (220) and (311), and a volume fraction of grains in the main grain direction in the metal foil is between 5% and 50% respectively.

Specifically, a flatness of the made high-flatness metal foil can be obtained from data of three-dimensional flatness measured by a three-dimensional surface flatness meter, and the expression of the three-dimensional flatness (HSR) is as follows:

$$HSR=(((H*(X+Y))/(X*Y))*100$$

H is a height of a raised region on the foil; X is a width of the raised region measured from a cross section in a rolling direction; and Y is a width of the raised region measured from a widthwise (transverse) cross-section.

As shown in FIG. 8, in each screen area of each 8 edge subpixel points of a screen area (cell) on the whole large-area fine metal mask strip, differences between a total longitudinal length $TP_x$ and a total transverse width $TP_y$ of the fabricated high-flatness metal foil and design values and differences therebetween (e.g., between $TP_{x1}$, $TP_{x2}$ and $TP_{x3}$; or between $TP_{y1}$ to $TP_{y15}$) need to be within a few microns. When the difference of the total length of $TP_{x1}$ and $TP_{x3}$ is less than +20 μm, the range between the total widths $TP_y$ (between $TP_y$ max. and $TP_y$ min.) is within +5 μm, the fine metal mask strip can be used to make high-quality AMOLED display screens for smartphones.

Definitions of the total spoke length and total spoke width are as follows:

$TP_{x1}$=(measured distance between points 1-15–theoretical distance between points 1-15)

$TP_{x2}$=(measured distance between points 25-16–theoretical distance between points 25-16)

$TP_{x3}$=(measured distance between points 26-40–theoretical distance between points 26-40)

$TP_{y1}$=(measured distance between points 1-26–theoretical distance between points 1-26)

$TP_{y7}$=(measured distance between points 7-32–theoretical distance between points 7-32)

$TP_{y15}$=(measured distance between points 15-40–theoretical distance between points 15-40)

The three-dimensional flatness (HSR) can be measured by a probe altimeter, an optical altimeter, a surface altimeter, etc. The resulting data can be represented by a three-dimensional contour chart, as shown in FIGS. 9-11, 12-14 and 15, a high-flatness metal foil fabricated by large-area precision rolling, due to uneven distribution of internal stresses, is presented as raised regions of different surface heights. The edge waviness regions on both sides and all the main raised regions in the center are measured one by one, and after statistics, individual and average three-dimensional flatnesse and area ratios of the edge waviness region raised regions, individual and average three-dimensional flatnesse and area ratios of the raised regions at the center, and area ratios of the flat regions without protrusions can be calculated.

When making a fine metal mask strip with small total length difference ($TP_{x1}$–$TP_{x3}$ to <±20 μm) and small total width difference ($TP_y$ max. $TP_y$ min.)<±5 μm), the average three-dimensional flatness (HSR) of the edge waviness regions on both sides needs to be below 1.5%, preferably below 1%; and the average three-dimensional flatness (HSR) of the center needs to be below 1%, preferably below 0.8%.

The residual stress of the high-flatness metal foil also needs to be low, and can be measured by a high-precision X-ray diffraction (XRD) or two-dimensional nanoindentation, typically needs to be not more than 200 MPa, preferably below 140 MPa, to reduce local stress relief and deformation of the foil after etching, affecting its function as a fine evaporation deposition shadow mask. In a natural state, a 500 mm high-flatness metal foil laid flat on a marble platform should be free of curling phenomenon, and a height of material warpage should be not more than 15 mm. Alternatively, a 1 m long metal foil is hanged to measure its bending amount; and a total bending amount shall be not more than 30 mm. If the metal foil is etched to its half thickness on one side so as to maximize uneven distribution of its internal stress, for example: after etching to ½ of the thickness on either side, a 60×250 mm metal foil laid flat on the marble platform should be free of curling phenomenon, and the height of the material warpage should be not more than 40 mm.

After the final precision rolling and heat treatment, a microstructure thereof has a preferred grain and crystalline phase structure. As shown in FIG. 16, a main crystalline phase of a polycrystalline and microcrystalline phase structure of a conventional invar steel is that, as shown in an invar standard sample in FIG. 16, a volume fraction of the grains in the grain direction (111) is about 50%, the volume fraction of the grains in the grain direction (200) is about 25%, and the volume fractions of the grains in the grain direction (220) and the grain direction (311) are about 10% respectively. A proportion of the grains in the grain direction (222) is less than 5%. However, the preferred grain directions of the grain structure of the high-flatness invar metal foil made in Examples 1 to 3 are concentrated in three directions (200), (220) and (311); depending on components, precision rolling and subsequent annealing heat treatment, the volume fraction of the grains in the grain direction (200) accounts for ≥30%, the volume fraction of the grains in the grain direction (220) accounts for ≥9%, and the volume fraction of the grains in the grain direction (311) accounts for ≥10% (volume fraction, volume %). A grain fraction of the high-flatness metal foil of the disclosure in the grain direction (111) accounts for <10%, which has an important impact on physical properties of the high-flatness metal foil and the subsequent precision micropore patterning process of the fine metal mask compared with the relatively preferred orientation of the crystalline phase structure of the conventional invar material.

Through tension leveling, the technical problem of poor flatness of the thin metal strip made by the precision rolling only is solved. However, the process of making the thin metal strip made by the precision rolling is mainly due to unequal longitudinal (rolling direction) extensions of upper and lower surfaces of the steel strip during the precision rolling; and residual stress caused by uneven plastic deformation in the middle in the width direction. If this residual stress is too great, a "bulging" raised region will form on the foil; or a warped region will form at a cut edge. In order to manufacture a metal foil suitable for making a fine metal mask, low temperature heat treatment may also be performed before and/or after the tension leveling (S104) to ensure residual stress relief in order to ensure flatness.

Example 2

Figure 2:
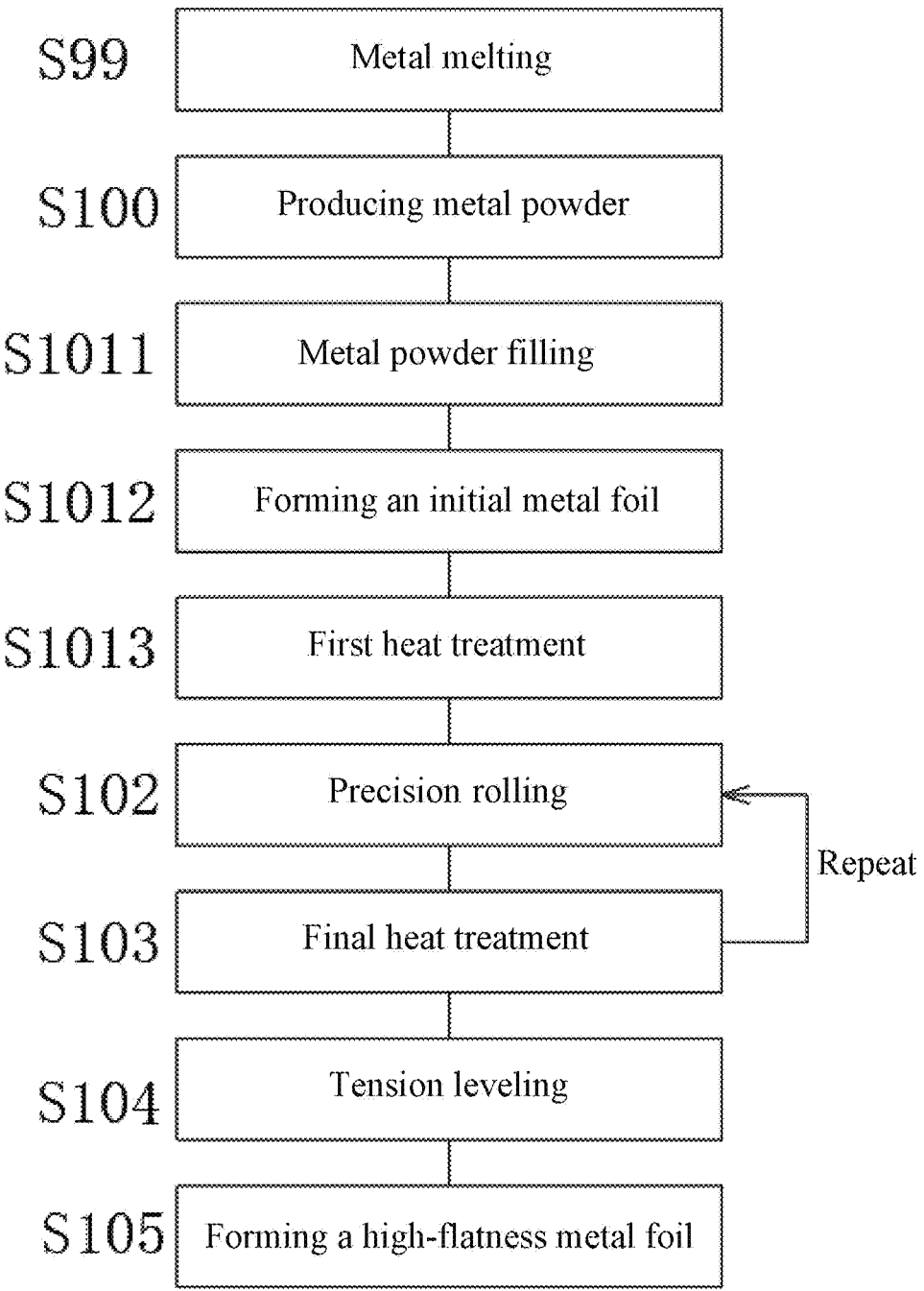
FIG. 2 is a process flow diagram of a high-flatness metal foil (II)

As shown in FIG. 2, this example describes a method for preparing a high-flatness metal foil suitable for making a metal mask in a manner similar to that of Example 1, but differs from Example 1 in that in step S101, a method for forming a raw metal coarse foil comprises the following steps:

S1011, metal powder packing: packing clean metal powder experiencing particle size screening into a metal powder dispenser of a laser melting processing apparatus where the metal powder within a desired powder particle size range is selected for screening;

S1012, metal coarse foil forming: uniformly injecting, by the metal powder dispenser, the metal powder onto a substrate on a working platform in the laser melting processing apparatus to form a metal powder layer, and then welding, by a laser plane scanner in the laser melting processing apparatus, the metal powder layer into a metal coarse foil, where thickness of the metal powder layer laid is in the range of 1-300 μm, and the thickness of a single-layer thick and thin metal foil formed by laser melting is dependent on the particle size of the metal powder and laser energy, and the laser melting can be used to make a high-cleanliness metal coarse foil with a general thickness of 5 μm-5 mm; and this process can be repeated many times as necessary to achieve a predetermined foil thickness when the laser melting apparatus is single station type. When the laser melting apparatus is an in-line automatic processing system connected in series with a plurality of stations, it is thus possible to set up a plurality of laser melting apparatuses, add thickness and perform laser melting to obtain a foil with the predetermined thickness, and a primary heat treatment device can also be added between the laser melting stations as required.

S1013, primary heat treatment: performing, by the heat treatment device, heat treatment at least once on the metal coarse foil according to a preset temperature and a preset time to form the raw metal coarse foil, and then proceeding to step S102, where the heat treatment may be performed a plurality of times or only once.

Preferably, in step S1013, the primary heat treatment is selected from at least one of annealing, stress relief and material stabilizing aging treatment, a heat treatment atmosphere is selected from a dry inert atmosphere or a reducing atmosphere or a vacuum environment, the preset temperature ranges from 60±5° C. to 1050±25° C., and the preset time is 2 seconds to 5 hours; and in step S103, the final heat treatment is selected from at least one of annealing, stress relieving and material stabilizing aging treatment, the heat treatment atmosphere is selected from the dry inert atmosphere or the reducing atmosphere or the vacuum environment, the preset temperature ranges from 60±5° C. to 1050±25° C., and the preset time is 2 seconds to 5 hours.

The heat treatment is desirably performed in a controlled atmosphere, and the atmosphere may be a dry inert atmosphere (e.g., argon (Ar)) with an oxygen content below 100 ppm. If the material has more stringent requirements, a dry reducing atmosphere can be used, such as a mixture of argon and hydrogen, hydrogen or a vacuum environment. If the secondary heat treatment is performed a plurality of times, the temperature used should be successively decreased to obtain a stable metal foil with a low residual stress.

If the metal powder thickness is very thin, or the thickness of an initial coarse metal foil is large, steps S102 and S103 may be repeated several times to achieve a target thickness of a laser melted high-flatness metal foil. A high-cleanliness fine metal foil with a thickness ranging from 5 μm to 5 mm is made after the secondary heat treatment.

Preferably, the method further comprises a metal powder forming step which comprises the following steps:

S99, metal melting; melting selected high-purity metal materials in a vacuum melting manner so that the metal materials become a molten state; when selecting pure metals, selecting several pure metal raw materials with a purity more than 99% and an oxygen content less than 2000 ppm or an oxygen content less than 200 ppm for melting in a vacuum melting furnace after composition proportioning at a temperature ranging from 350 to 1700° C., a vacuum degree ranging from 0.01 to $10^4$ Pa or from $10^{-4}$ to 100 mbar, and a melting power of 200-1200 KW.

S100, making metal powder: atomizing, cooling and solidifying the metals in the molten state to form fine clean metal powder, where the metals in the molten state are atomized in an inert, reducing, or vacuum atmosphere, and particle size of the powder is in the range of 0.1-60 μm.

Preferably, in step S99, remelting is performed according to desired cleanliness or purity of the metals by means of electroslag remelting or vacuum arc remelting.

Based on the processing method in step S1012, under the environment 9 of an inert atmosphere or a reducing atmosphere, the metal powder dispenser 1 moves along an X axis or the X axis to a Y axis so as to dispense a layer of metal powder on the substrate of the working platform, and the thickness of the dispensed metal powder layer is 1-300 μm; at this time, the laser plane scanner performs plane scanning and welding on the metal powder layer; during scanning, the laser energy is 50-500 W, a laser energy density is 10-350 J/mm³, and a scanning speed is 100-5000 mm/sec, so that the metal powder layer 2 on the substrate is welded with the formed metal coarse foil 8 to form a continuous metal coarse foil, where the continuous metal foil is formed by welding the metal coarse foils on the substrate section by section, and then the process proceeds to step S1013.

Figure 5:
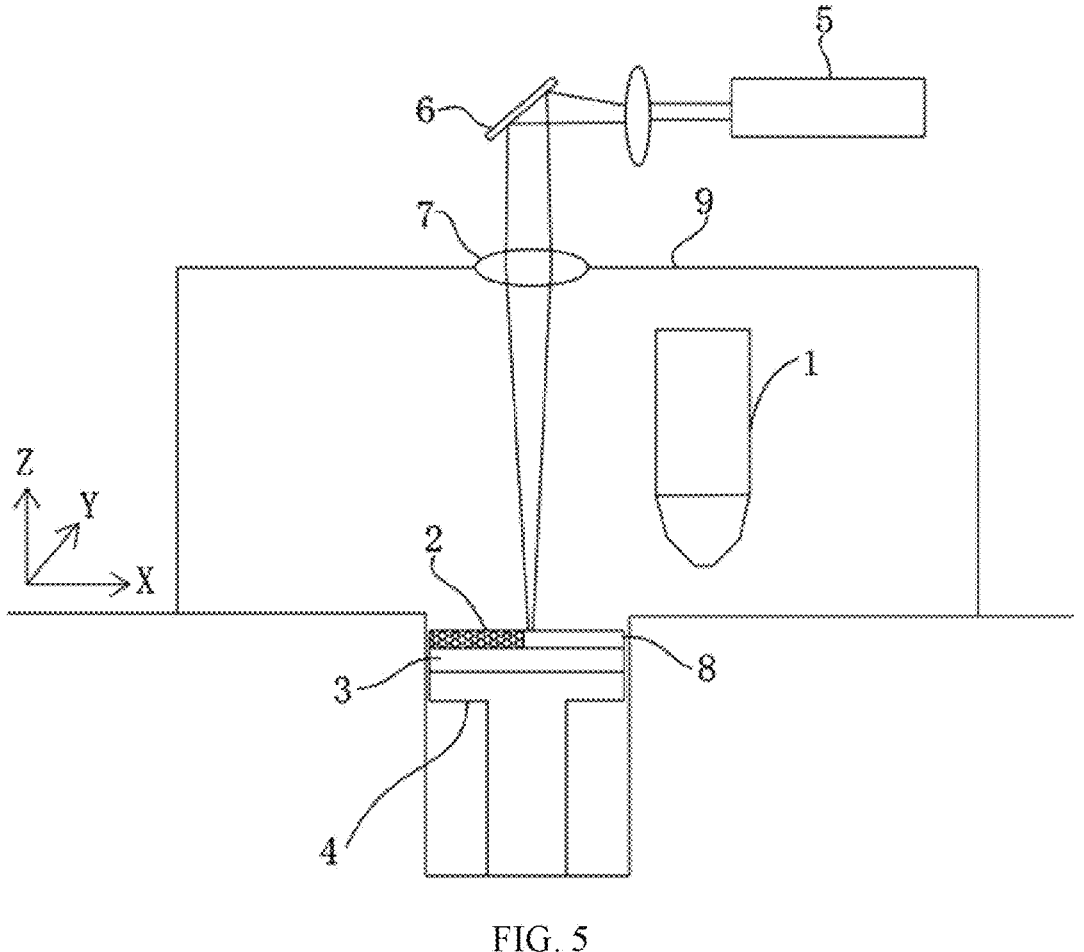
FIG. 5 is a block diagram of an apparatus for laser melting a metal foil.

As shown in FIG. 5, the working platform 4 is used for placing the substrate 3 and laying the metal powder layer and laser melting the metal foil. The working platform can be precisely (1±0.2 μm) adjusted in a Z direction so that when multi-layer metal foil welding is required, the platform can be lowered, and the steps of dispensing the metal powder layer and laser melting can be repeated to obtain the laser melted metal coarse foil with the desired thickness. The general thickness of the high-cleanliness metal coarse foil is 5 μm to 5 mm.

The laser plane scanner comprises a laser 5, an X-Y plane scanning mirror 6 and a focusing optical lens group 7.

A high energy laser is used to provide laser energy to irradiate the metal powder layer 2 so as to melt and solidify the powder layer into a metal foil. The laser energy is generally in the range of 50-500 W. A most suitable laser can be selected according to the material, such as solid–state lasers like ytterbium fiber laser and Nd: YAG laser and gaseous lasers like $CO_2$ laser and excimer laser. Wavelengths of the laser comprise the laser wavelength ranges of infrared light (946 nm to 10.6 μm), visible light (488 to 694 nm) and ultraviolet light (157-355 nm).

X-Y plane scanning mirror: It reflects the energy projected from the laser to the metal powder layer on the working platform. The scanner enables fast and accurate scanning on a X-Y plane.

Focusing optical lens group: It projects light energy from the scanning mirror onto the area of the metal powder layer to be melted.

Laser melted metal foil: In the process of metal laser melting, the metal powder is irradiated by laser light, and then melted at high temperature, and bonded with each other and rapidly solidified into an integrated laser melted high-cleanliness metal foil.

Atmosphere-controlled environment: In order to reduce formation of oxides or nitrides in the laser melted metal foil, the laser melting process must be performed in an atmosphere-controlled environment. The atmosphere can be an inert atmosphere (e.g., argon (Ar)) with an oxygen content below 100 ppm. If the material has more stringent requirements, a reducing atmosphere can be used, such as a mixture of argon and hydrogen, hydrogen or a vacuum environment.

As shown in FIG. 7, based on the processing method in step S1013, a continuous metal coarse foil is separated from a substrate by winding the substrate on a reel I 11 and winding the continuous metal coarse foil on a reel II 12, and the welded metal coarse foil is transferred to the heat treatment device for the primary heat treatment to perform heat treatment, and the substrate and the continuous metal coarse foil are respectively wound into rolls after completion of the primary heat treatment, where the laser melted metal coarse foil still has many defects after the heat treatment, such as micropores, rough surfaces and uneven thickness. A relative density of the high-cleanliness metal coarse foil reaches more than 92% of a standard value of the metal material to be made (e.g., ASTM international standard). The non-raw material of the component contains low amounts of impurities, such as nitrogen (N)<0.01 wt. %, sulfur (S)<0.01 wt. %, carbon (C)<0.02 wt. % and phosphorus (P) <0.02 wt. %, further precision processing is needed to improve the quality of the foil. At this time, the process proceeds to step S102.

Based on the processing method in step S102, the coarse metal foil released from a rolled continuous coarse metal foil is precision cold rolled at least once, so that the continuous metal coarse foil can be made into a rolled metal foil with a desired thickness and a flat surface, and then the process proceeds to step S103 which eliminates residual micropores, densifies and planarizes the metal foil, resulting in a flat-looking metal foil with uniform thickness. Precision cold rolling is generally done with a precision rolling mill. If the laser melted metal foil raw material is thick, it is also possible to first use a cold rolling mill for rolling, then perform heat treatment, and then use a roll mill for precision rolling. The thickness reduction ratio of rolling ranges between 5% and 80%. The higher the reduction ratio, the higher the work hardening of the material so that the processing becomes difficult, and the defects increase, and the yield decreases. The thickness reduction ratio is preferably between 25% and 60%. The precision cold rolling can manufacture 10-100 micrometer (μm) thick of high-flatness metal foils which can be repeatedly rolled a plurality of times to achieve the desired thickness.

Based on the processing method in step S103, the rolled thin metal foil experiencing at least once precision cold rolling is subject to at least once secondary heat treatment, and after the secondary heat treatment is completed, the process proceeds to step S106, so as to obtain the rolled high-flatness metal foil;

S106, cutting the rolled high-flatness metal foil to obtain a required size, and proceeding to step S107;

S107, performing quality inspection on the cut high-flatness metal foil, and obtaining a rolled high-cleanliness fine metal foil after the inspection is completed. The relative density of the final high-flatness metal foil reaches more than 98% of the standard value of the metal material to be made (e.g., ASTM international standard). The non-raw material of the component contains low amounts of impurities, such as nitrogen (N)<0.01 wt. %, sulfur (S)<0.01 wt. %, carbon (C)<0.02 wt. % and phosphorus (P)<0.02 wt. %. After the material has been cleaned, a length of 1000 mm is cut and placed on an optical detection device to scan for defects (e.g., impurities, foreign matters and micropores); and the number of defects greater than 3 μm is less than 100.

The new manufacturing method of this example can be used to make a laser melted high-flatness metal foil. The method can be used to make metal foils with good mechanical strength and physical properties, uniform composition, large area, high cleanliness and high making efficiency.

The above process solves the problem that Japanese companies, such as Toshiba, have used alloys with low expansion coefficients, such as Invar 36 (Fe—Ni36) since 1985, for shadow mask application for color CRTs. Around 2010, invar alloys were also used in the application of fine shadow masks for evaporation-deposited AMOLEDs. By now, the metal foils used in the display industry are all Invar 36 made by traditional manufacturing processes. Such material has the technical problems of low metal cleanliness and high making cost, and the technical problems of electroforming a shadow mask of Invar 36 material for fine metal masks of the AMOLED, and also faces the technical problems of being unable to realize desired composition, uniformity of properties, mechanical strength and large size.

The above-mentioned process can be used to make invar alloy metal foils, and also can be used to make such metal foils as stainless steel, iron-nickel (Fe—Ni) alloy, nickel (Ni) alloys, titanium (Ti) alloys, aluminum (Al) alloys and superalloys (Fe—Ni—Co alloys). The laser energy density for laser melting metal powder of the above metals into a stable melting zone of a thin metal foil is between about 10 and 350 $J/mm^3$. For example, a suitable stable laser melting energy density for invar alloy is about 45 to 95 $J/mm^3$, while a stable laser melting energy density is about 50 to 115 $J/mm^3$ for other metals such as 316 stainless steel. The physical properties of the resulting invar alloy are comparable to conventional materials, but the resulting Invar alloy has higher cleanliness, lower cost, and shorter manufacturing period.

The method for preparing a metal foil described in the example has fewer process steps, lower investment in manufacturing apparatus, and shorter overall manufacturing process and supply chain for the metal foil formed by laser melting. In addition, the resulting metal foil has less impurities and pollutants caused by different processes, better overall cleanliness and purity, and easier quality control. The method reduces a number of high temperature processes, and has high yield. The yield of thin ($R_a$<0.1 μm) metal foils with high flatness can generally be higher than 50%; the laser melted metal foils, because of the use of the metal powder, can provide special microstructure features or the possibility of new different crystalline phases and microstructure control by rapid melting and solidification again; and the metal foil formed by laser melting has uniform composition, can be manufactured in a large area and has the advantages of high cleanliness and high making efficiency.

Based on the above, when Invar alloy powder is selected as the metal powder, the specific primary heat treatment and secondary heat treatment methods are as follows:

The primary heat treatment is selected from annealing, stress relief and material stabilizing aging treatment, the annealing treatment temperature is >600° C., the stress relief treatment temperature is 250-400° C., the material stabilizing aging treatment temperature is 60-200° C., and the time is 2 seconds-72 hours; and the secondary heat treatment is selected from annealing, stress relief and material stabilizing aging treatment, the heat treatment temperature ranges from 200±5° C. to 1450±25° C., and the time ranges from 2 seconds to 48 hours. Here, the heat treatment needs to be carried out in a controlled atmosphere. The atmosphere may be a dry inert atmosphere (e.g., argon (Ar)) with an oxygen content below 100 ppm. If the material has more stringent requirements, it is possible to use a dry reducing atmosphere, such as a mixture of argon and hydrogen, hydrogen or a vacuum environment. Since the work hardening occurs when the metal foil is subjected to precision cold rolling, the secondary heat treatment is used to recrystallize the work hardened metal foil, and remove the internal stress and reduce slight deformation of the foil which may be caused by stress release, thereby improving performance of the metal foil.

Figure 6:
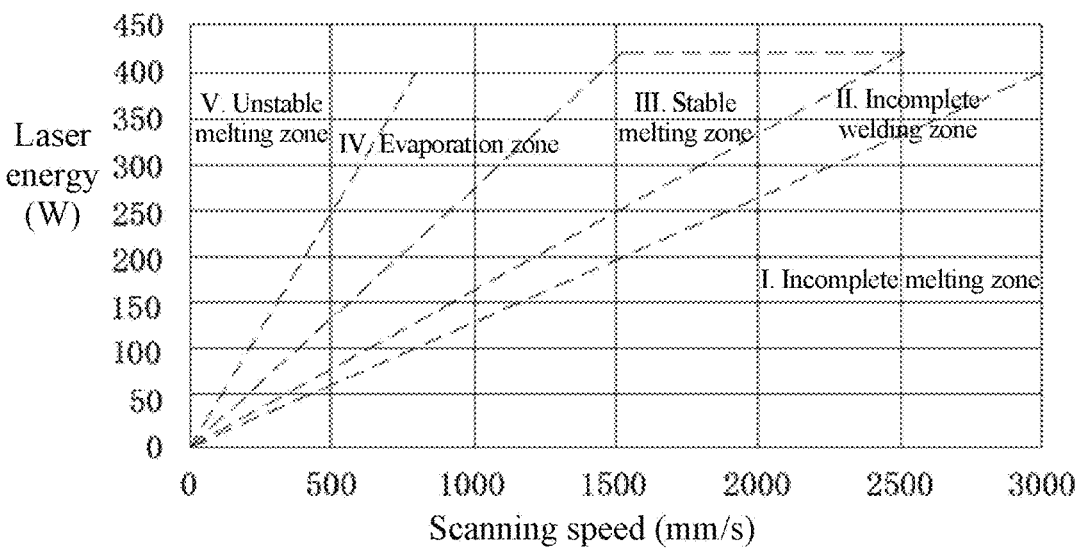
FIG. 6 is a schematic diagram of an invar metal powder laser processing and melting example.

Invar alloy (Fe—Ni: 35-39 wt. %) powder with a size range of 2-50 m is selected in the above-mentioned process to form an invar alloy foil, with a laser energy of 50 W to 400 W and a laser scanning speed of 50-3000 mm/sec. As shown in FIG. 6, the overall making results can be summarized as follows.

Region I namely incomplete melting zone: When the scanning speed is too fast, or the laser energy is too low, the metal powder cannot be completely melted.

Region II namely incomplete welding zone: When the laser energy is higher than that in region I, part of the powder may be melted, but part of the powder cannot be completely melted, so that the entire welded foil has many defects due to incomplete welding.

Region III namely stable melting zone: As the laser energy continues to increase, or the scanning speed is slow, most of the powder can be completely melted, bonded and solidified to form a dense thin metal foil. Although stable melting processing conditions can be obtained within the laser energy range of 50 W to 400 W and the laser scanning speed of 50-3000 mm/sec, an optimized processing range can be obtained within the laser energy range of 200 W to 350 W and the laser scanning speed of 800-2000 mm/sec, taking into account a sufficiently large stable processing zone for mass making. However, the range of optimized laser melting parameters may vary due to the effects of adjustments of a number of processing parameters.

Region IV namely evaporation zone: When the laser energy is too high, or the scanning speed is too slow, too much energy may cause evaporation of some of the molten metals, resulting in increase of defects.

Region V namely unstable melting zone: As the laser energy continues to increase, or the scanning speed is too slow, the metal powder is melted and evaporated in a large amount to cause unstable melting, resulting in a metal foil with a large number of holes and surface defects.

Laser melting of metal foils requires a suitable laser energy and scanning speed in the stable melting zone. For laser melted invar metal powder, generally, the metal powder of iron-based alloys has a laser energy density of about 10 to 350 J/mm³ in the stable melting zone. A suitable stable laser melting energy density for the invar alloy is 45-95 J/mm³. However, the optimized laser melting parameters may vary due to the effects of adjustments of a number of processing parameters. There are still a few micropores, rough surfaces, and residual stresses in the laser melted metal foil that require subsequent processes to improve them to obtain a fine thin invar metal foil with high quality, high cleanliness and high flatness.

Example 3

Figure 3:
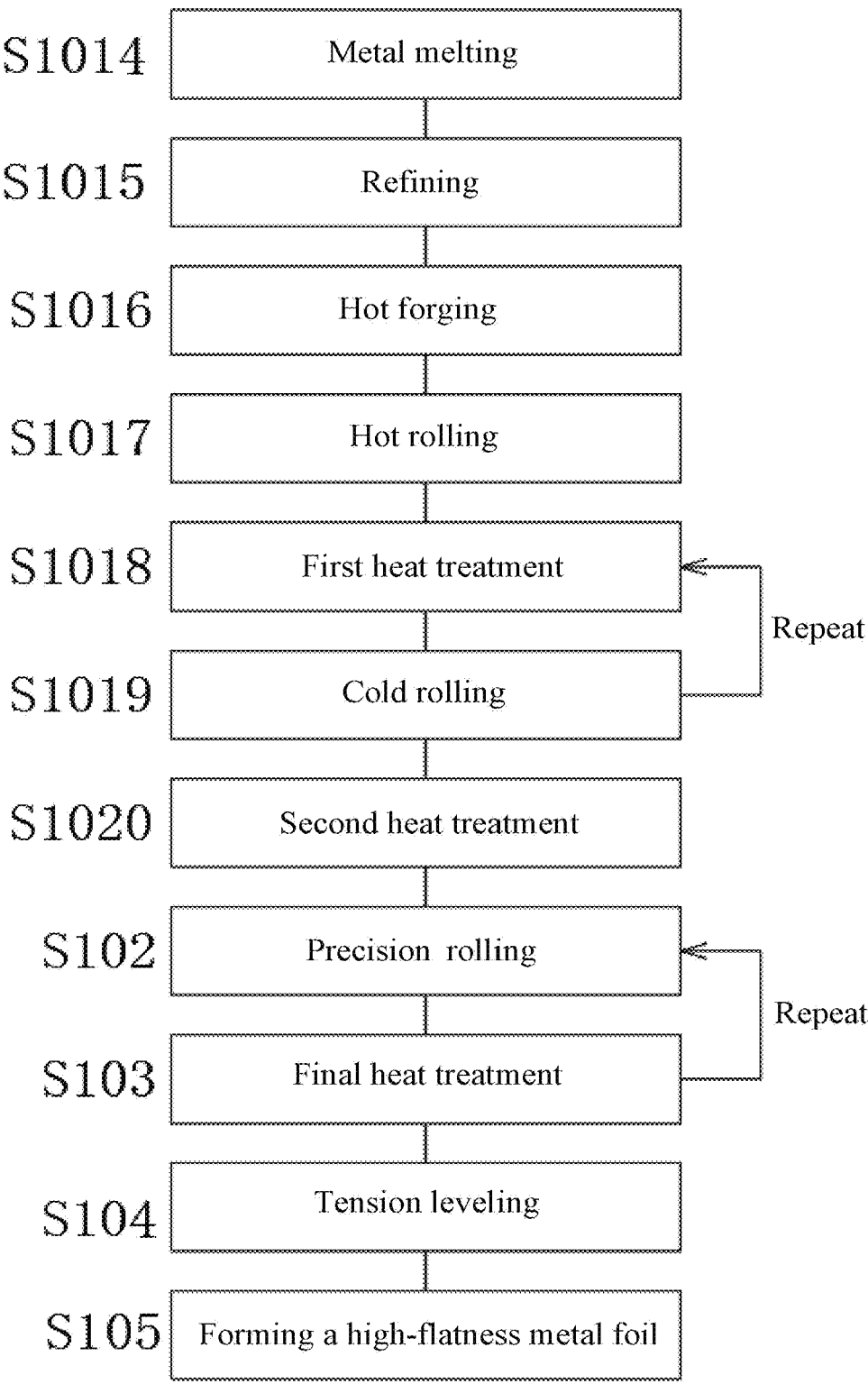
FIG. 3 is a process flow diagram of a high-flatness metal foil (III)

As shown in FIG. 3, this example describes a method for preparing a high-flatness metal foil suitable for making a metal mask in a manner similar to that of example 1, but differs from example 1 in that in step S101, a method for forming a raw metal coarse foil comprises the following steps:

S1014, metal melting: sorting and cleaning metal raw materials obtained from rough melting or recovered metal materials, then proportioning and adjusting the metal raw materials according to components of an alloy to be melted, adding a reducing agent and the like to perform metal melting, and pouring a resulting molten metal into a casting mold to solidify the metal into an ingot; where during melting, molten steel can be sampled to test its composition, and necessary component adjustment can be made. Melting is a high-temperature, intense process in which many chemical and physical reactions occur simultaneously. After melting, the molten metal is poured into a casting mold to solidify the metal into an ingot. During melting and pouring into the ingot, many impurities remain or are carried from contact with various surfaces into the solidified metal material, affecting the properties of the material. If it is necessary to obtain a high purity or cleanliness, the raw materials with higher purity can be used; and vacuum melting can also increase the purity of metals that readily react with air, such as titanium or nickel.

S1015, refining: refining the ingot to form a metal ingot, where this step reduces internal impurities.

S1016, hot forging: performing high-temperature forging on the refined metal ingot so as to forge a large cylindrical metal ingot into a square metal block, where this step allows for subsequent high-temperature forming.

S1017, hot rolling: performing surface treatment on the hot forged metal block, and performing continuous hot rolling to make the metal block into metal sheets in millimeters to centimeters in thickness;

S1018, primary heat treatment: performing heat treatment at least once on the hot-rolled metal sheets to adjust microstructure and stress;

S1019, cold rolling: performing surface treatment on the metal sheets, removing surface oxide layers and washing the metal sheets, and performing cold rolling treatment at least once on the washed metal sheets; and the cold rolling may be performed once or more times.

S1020, secondary heat treatment: performing heat treatment at least once on the cold rolled metal sheets to adjust the microstructure and internal stress so as to form the raw metal coarse foil, and proceeding to step S102, where the heat treatment may be performed once or more times to make a thinner metal material, steps S1019 and S1020 should be repeated to achieve a desired sheet metal thickness. Generally, cold rolling can result in sheet metals with thicknesses less than 1 mm.

The making of the metal foil requires multiple processes of melting, forming and heat treatment to obtain a thin (≤0.1 mm) metal foils with high flatness. A high-cleanliness invar (Fe, Ni: 35-39 wt. %) metal foil with a low thermal expansion coefficient less than $2\times10^{-6}/°$ C. (−50 to 100° C. temperature range) can be selected for making a fine metal mask, or other metal materials with a low thermal expansion coefficient can be used, such as an iron-nickel-cobalt alloy (Fe, Ni: 31-39 wt. %, Co: 0.02-6 wt. %); an iron-nickel alloy (Fe—Ni: 42-46%); an iron-nickel-manganese alloy (Fe, Ni: 35-37 wt. %, Mn+Si+Cr=0.001-1 wt. %); and an iron-nickel-cobalt alloy (Fe, Ni: 28-33%, Co: 13-17 wt. %), or an iron-cobalt-chromium alloy (Co: 52-54 wt. %, Cr: 9-10 wt. %, and Fe).

Example 4

Figure 4:
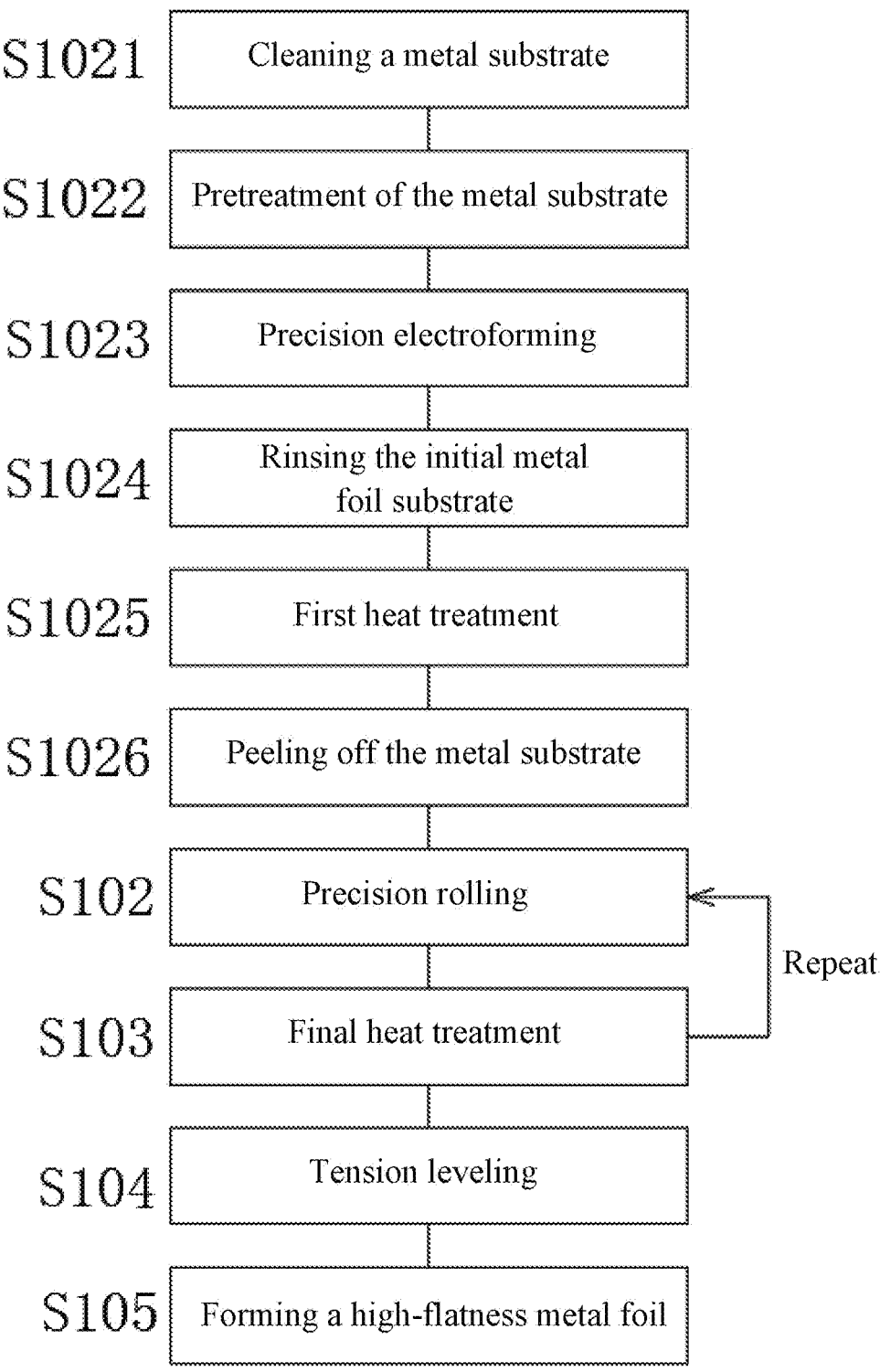
FIG. 4 is a process flow diagram of a high-flatness metal foil (IV)

As shown in FIG. 4, this example describes a method for preparing a high-flatness metal foil suitable for making a metal mask in a manner similar to that of example 1, but differs from example 1 in that in step S101, a method for forming a raw metal coarse foil comprises the following steps:

S1021, cleaning a metal substrate: using a chemical cleaning agent to remove residues, contaminants, organic substances and an oxide layer from a surface of a stainless-steel substrate, washing the substrate with water after completion of the removal, and further air-drying the metal substrate after the washing with water;

S1022, pretreatment of the metal substrate: soaking the surface of the metal substrate with a high-concentration acid solution, washing with water after completion of the soaking, and further air-drying the metal substrate after the washing with water; and soaking the surface of the substrate in a high-concentration acid solution (e.g., a hydrochloric acid solution, 10-30%); alternatively, soaking the substrate with a potassium dichromate solution (5-15%).

S1023 precision electroforming: connecting the metal substrate to a negative electrode, and then putting the metal substrate into an electroforming tank for electroforming so as to form a metal coarse foil substrate; where in the case of electroforming an invar metal substrate, the tank contains nickel and iron compounds and various additives, such as $NiSO_4$-$6H_2O$, $NiCl_2$-$6H_2O$, Boric acid, $FeSO_4$-$7H_2O$, malonic acid and saccharin sodium. Where a pH value of a plating solution is controlled between 2.0 and 3.5, and the temperature is controlled between 35-55° C., and real-time uniform stirring is performed to ensure uniformity of the electroformed metal foil. Electroforming current density is about 30-50 mA/cm². The thickness of the deposited electroformed film can be controlled by concentration of electroforming tank composition, the current density, and the time the metal substrate is in the tank.

S1024, washing the metal coarse foil substrate: washing off an electrolyte on the metal coarse foil substrate formed by the electroforming with water, and air-drying the substrate after completion of the washing;

S1025, primary heat treatment: placing the cleaned metal coarse foil substrate in a heat treatment environment to adjust a crystalline phase microstructure and relieve an internal stress; and S1026, peeling off the metal substrate: after the primary heat treatment, mechanically peeling off the metal coarse foil substrate from the metal substrate to form the raw metal coarse foil, and proceeding to step S102.

Preferably, in step S1013, the primary heat treatment is selected from at least one of annealing, stress relief and material stabilizing aging treatment, the heat treatment atmosphere is selected from the dry inert atmosphere or the reducing atmosphere or the vacuum environment, the preset temperature ranges from 300° C. to 700° C., and the preset time is 2 seconds to 2 hours.

In step S103, the final heat treatment is selected from at least one of annealing, stress relief and material stabilizing aging treatment, the heat treatment atmosphere is selected from the dry inert atmosphere or the reducing atmosphere or the vacuum environment, the preset temperature ranges from 300±5° C. to 775±25° C., and the preset time is 2 seconds to 1 hours.

Example 5

This example describes a method for preparing a fine metal mask (FMM) which comprises using the method for preparing a high-flatness metal foil described in example 1 or example 2 or example 3 or example 4, and a high-flatness metal foil obtained by the method for preparing a high-flatness metal foil is used to form a fine metal mask strip, and the fine metal mask strip is used for making a product for evaporation deposition of an AMOLED light emitting device, and the method is specifically as follows:

The metal foil is selected from high-cleanliness invar alloy (Fe, Ni: 35-39 wt. %) metal foils with a thermal expansion coefficient less than $2×10^{-6}/°$ C. (−50 to 100° C. temperature range), or other metal materials with a low thermal expansion coefficient can be used, such as an iron-nickel-cobalt alloy (Fe, Ni: 31-39 wt. %, Co: 0.02-6 wt. %); an iron-nickel alloy (Fe—Ni: 42-46%); an iron-nickel-manganese alloy (Fe, Ni: 35-37 wt. %, Mn+Si+Cr=0.001-1 wt. %); and an iron-nickel-cobalt alloy (Fe, Ni: 28-33%, Co: 13-17 wt. %), or an iron-cobalt-chromium alloy (Co: 52-54 wt. %, Cr: 9-10 wt. %, and Fe).

S301, cleaning: removing contaminants or oxide layers on the surface of the metal foil to clean the surface of the metal foil; where when cleaning, a cleaning agent is used to clean the surface of the metal foil.

S302, metal foil pattern processing: applying a patterning process to the cleaned metal foil to form a patterned metal foil required for a metal mask;

S303, cutting the patterned metal foil according to a set size to form a fine metal mask strip;

S304, detection: performing quality detection on the fine metal mask strip to determine whether the fine metal mask strip complies with delivery specifications; and S305, packaging: packaging and shipping the fine metal mask strip conforming to the requirements.

Example 6

As shown in FIG. 17, this example describes a method for preparing a fine metal mask, the method is generally consistent with that of example 5, but differs only in that the specific process of patterning a metal foil in step S302 comprises the following steps:

S3021, attaching a photoresist film: attaching a photoresist film on the cleaned metal foil; if it is necessary to enhance the adhesion force, it is possible to use vacuum attaching, high-temperature baking or use an interface adhesive. Instead of using a dry film photoresist, a film-coated photoresist together with the high temperature baking may be used in the making of a sheet metal foil.

S3022, exposure: placing the metal foil attached with the photoresist film on an exposure machine, where light irradiated by the exposure machine passes through a photomask, and a pattern to be made is projected on the photoresist; alternatively for the metal foil attached with the photoresist film, directly writing the pattern to be made on the photoresist film by directly irradiating the pattern with laser on the photoresist film by laser in a laser direct-writing imaging mode; exposing both sides of the metal foil simultaneously without use of the photomask.

S3023, developing: immersing the exposed photoresist film and the metal foil into a developing solution, so that a portion which has been exposed to illumination induction is cured and remains, while the portion which has not undergone the illumination induction is dissolved by the developing solution, and the projected pattern appears on the remaining photoresist;

S3024, wet etching: placing the developed photoresist film and the metal foil in an etching tank, where the portion of the metal foil which is not covered by the photoresist film is in contact with an etching solution, and chemically reacts to etch the contacted metal, and after the etching is completed, the pattern on the photoresist is etched on the metal foil, and the wet etching can be done sequentially on both sides separately or simultaneously;

S3025, removing the photoresist: after the etching is complete, taking the photoresist film from a stripper, and leaving the metal foil etched with the pattern to form a patterned metal foil.

The above steps may be applied to roll-to-roll making of a rolled continuous metal foil to form a fine metal mask as shown in FIG. 18.

During the roll-to-roll making, the wet etching makes micropores sizing in the range of 8 μm to 1000 μm. The area of a micropore array region subject to each wet etching depends on a size of the fine metal mask required for making an AMOLED display. The current AMOLED mass production line for smartphones is G6 half-substrate (925 mm×1500 mm). Therefore, when an FMM is made, single exposure area on the thin metal foil will be in a similar size range. The photoresist is removed, leaving only the invar metal foil with a subpixel design pattern on an AMOLED display required for a fine metal mask (FMM).

In addition to the roll-to-roll making, the high-flatness metal foil may also be cut into sheets, framed and processed in a similar manufacturing process to make a fine metal mask (FMM) strip product.

Example 7

As shown in FIG. 19, this example describes a method for preparing a fine metal mask, the method is generally consistent with that of example 5, but differs only in that the method further comprises step S300 which before step S301 and comprises cutting a metal foil to form a sheet metal foil, framing the sheet metal foil, and then cleaning the framed metal foil according to the processing method of step S301, and proceeding to step S302 after the cleaning. The framing is due to thin thickness of the metal foil, avoiding damage caused by transfer during sample processing, and facilitating the preparation of fine metal mask strips.

In step S302, the specific process for patterning the metal foil comprises the following steps:

S3026, laser projection micropore processing: projecting high energy laser through a photomask onto a metal foil, so that the metal foil is ablated under the projection of a laser beam to form a micropore pattern, where this laser beam energy is projected through an optical system onto the metal foil, and local laser ablation on the foil caused by the high energy laser creates a micropore pattern on the metal foil as on the photomask. The choice of laser can be adjusted depending on the material to be ablated, such as gaseous lasers like carbon dioxide lasers, excimer lasers and solid-state lasers like ytterbium fiber lasers and Nd: YAG lasers.

As shown in FIG. 20, a specific laser projection micropore processing apparatus is as follows, and specifically comprises:

a high-flatness metal foil which is cut and placed in a frame and placed on a processing platform 410 in a processing cavity 412;

the processing platform 410 which is located in a processing cavity 412 of an apparatus for laser micropore processing a metal sheet, and can precisely move in a X-Y plane so that the laser micropore processing can be performed to laser ablate a micropore pattern on a thin metal foil 211;

the framed thin metal foil 211 which is fixed on the processing platform 410 which precisely moves in the X-Y plane to laser ablate a desired pattern in the entire thin metal foil by means of the photomask and a laser beam from spotlight projection;

processing cavity 412, where because the laser ablation is a high-energy, high-temperature process, a processing area and a work piece require a controlled atmosphere, and the controlled area is defined by the processing chamber;

an ambient atmosphere 413 as an atmosphere control is required in the processing cavity to reduce oxidation and nitriding of the metals; the atmosphere may be an inert atmosphere (e.g., argon (Ar)) with an oxygen content below 100 ppm: and if the material has more stringent requirements, a reducing atmosphere can also be used, such as a mixture of argon and hydrogen, hydrogen or a vacuum environment;

an optical transmission window 414, where in the processing cavity, the laser beam passes through a high-transmittance optical transmission window used by an area of the cavity so that the laser beam can effectively transmit on the thin metal foil sheet 211 being processed to complete the laser ablation of the irradiated area;

laser 415 which is a high energy laser and provides the desired laser beam; the laser energy is generally in the range of 1-500 W; a most suitable laser can be selected according to the material, such as different pulsed lasers (nanosecond, picosecond or femtosecond), solid state lasers like a titanium sapphire laser, an ytterbium fiber laser and an Nd: YAG laser, gaseous lasers like carbon dioxide lasers, argon lasers and excimer lasers; and wavelengths of the laser comprise the laser wavelength ranges of infrared light (946 nm to 10.6 μm), visible light (488 to 694 nm) and ultraviolet light (157-355 nm);

a laser beam homogenizer 416 which changes the beam energy distribution from a Gaussian curve distribution to a flat uniformly distributed laser beam, and may be a polygon beam homogenizer, a diffractive beam homogenizer or a microlens array beam homogenizer;

a photomask 417 which has a photic area and an opaque area on the photomask constituting a pattern distribution corresponding to subpixels of the AMOLED display; however, the size is larger than a desired subpixel device size (i.e., the size of the micropore array to be laser ablated on the metal foil); and an actual size of the micropore array pattern laser ablated on the thin metal foil depends on a projection magnification of a subsequent optical projection system (which comprises a lens system 418, a mirror 419, and a projection lens group 420);

the lens system 418 which focuses and uniformly projects the micropore pattern transmitted through the photomask on the mirror 419 and the projection lens group 420 on a subsequent light path thereof, where the mirror 419 modifies the pattern of the laser beam projected by the lens system 418 to reflect uniformly into the projection lens group 420;

the projection lens assembly 420 which focuses the incident laser beam pattern through the optical transmission window 414 and onto the thin metal foil sheet 211 to be laser ablated until the desired micropore array pattern is ablated. The working platform moves the thin metal foil to a next area and repeats the laser ablation process until the area to be processed on the whole surface of the thin metal foil is processed.

The laser-mentioned laser projection micropore processing is stepwise micropore array processing on the whole surface of the thin metal foil by fixing the optical system and by moving the working platform which can perform precise movement in the X-Y plane to changing the processing area. However, it is also possible to fix the working platform and the metal foil to be processed, and use an optical projection system having a scanning function to precisely change laser ablation area position so as to complete the micropore array processing on the whole surface of the metal foil to produce a fine metal mask (FMM) strip product only.

S3027, washing: removing contaminants from the metal foil having the micropore pattern to obtain a patterned metal foil.

As shown in FIG. 21, based on this example, a resulting rolled continuous invar alloy foil can be used to prepare a fine metal mask strip, and the size of the micropores obtained by the laser ablation is in the range of 2-300 μm. The area of the micropore array is generally between 10 and 300 mm² per laser projection ablation.

The above-mentioned preparation method can be used to make a metal foil with a low thermal expansion coefficient, such as a nickel alloy, an iron-nickel invar alloy, a nickel-cobalt alloy, a cobalt-chromium alloy, an iron-nickel-cobalt alloy, an iron-nickel-manganese alloy, and an iron-cobalt-chromium alloy. The physical properties of the resulting invar alloy are comparable to conventional materials, but the resulting invar alloy has higher purity and cleanliness, lower cost, and shorter manufacturing period.

What is claimed is:

1. A method for preparing a metal foil suitable for making a metal mask, comprising the following steps:

S101, forming a raw metal coarse foil, wherein a material of the formed metal coarse foil is one of invar alloy, iron-nickel alloy, iron-nickel-manganese alloy, iron-nickel-cobalt alloy and iron-cobalt-chromium alloy;

S102, precision rolling: rolling the raw metal coarse foil at least once into a metal foil with a required precision thickness and a flat surface, wherein the metal foil manufactured and formed after precision rolling is 5 μm to 5 mm;

S103, final heat treatment: performing, by a heat treatment device, heat treatment at least once on the metal foil experiencing the precision rolling according to a preset temperature and a preset time;

S104, tension leveling: performing tension leveling at least once on the metal foil experiencing the rolling and the heat treatment using a tension leveler; and S105, obtaining a metal foil after completion of the tension leveling, and forming a rolled metal foil in a continuous forming process.

2. The method for preparing a metal foil suitable for making a metal mask according to claim 1, wherein the invar alloy has a mass percentage composition of 35-39 wt. % Ni, with the balance being Fe and inevitable impurities; the iron-nickel alloy has a mass percentage composition of 42-46 wt. % Ni, with the balance being Fe and trace elements; the iron-nickel-cobalt alloy has a mass percentage composition of 31-39 wt. % Ni and 0.02-6 wt. % Co, with the balance being Fe and trace elements; the iron-nickel-manganese alloy has a mass percentage composition of 35-37 wt. % Ni, with total amount of Mn, Si and Cr being 0.001-1 wt. %, and the balance being Fe and trace elements; and the iron-cobalt-chromium alloy has a mass percentage composition of 52-54 wt. % Co and 9-10 wt. % Cr, with the balance being Fe and trace elements.

3. The method for preparing a metal foil suitable for making a metal mask according to claim 2, wherein in step S104, when the tension leveling is performed, the tension leveler applies a tension in the range of 3-30 kgf/mm², and the obtained metal foil is subjected to residual stress relief treatment under an atmosphere with a dry reducing gas and oxygen content below 100 ppm, or under a reducing atmosphere, or under a vacuum environment, at a temperature of 105±50° C. for 2-60 minutes.

4. The method for preparing a metal foil suitable for making a metal mask according to claim 3, wherein in step S101, the raw metal coarse foil is formed by a method comprising the following steps:

S1011, metal powder packing: packing clean metal powder experiencing particle size screening into a metal powder dispenser of a laser melting processing apparatus;

S1012, metal coarse foil forming: uniformly injecting, by the metal powder dispenser, the metal powder onto a substrate on a working platform in the laser melting processing apparatus to form a metal powder layer, and then welding, by a laser plane scanner in the laser melting processing apparatus, the metal powder layer into a metal coarse foil; and S1013, primary heat treatment: performing, by the heat treatment device, heat treatment at least once on the metal coarse foil according to a preset temperature and a preset time to form the raw metal coarse foil, and then proceeding to step S102.

5. The method for preparing a metal foil suitable for making a metal mask according to claim 4, wherein in step S1013, the primary heat treatment is selected from at least one of annealing, stress relief and material stabilizing aging treatment, a heat treatment atmosphere is selected from a dry inert atmosphere or a reducing atmosphere or a vacuum atmosphere, the preset temperature ranges from 60±5° C. to 1050±25° C., and the preset time is 2 seconds to 5 hours; and in step S103, the final heat treatment is selected from at least one of annealing, stress relief and material stabilizing aging treatment, the heat treatment atmosphere is selected from the dry inert atmosphere or the reducing atmosphere or the vacuum environment, the preset temperature ranges from 60±5° C. to 1050±25° C., and the preset time is 2 seconds to 5 hours.

6. The method for preparing a metal foil suitable for making a metal mask according to claim 4, further comprising a metal powder forming step which comprises the following steps:

S99, metal melting: melting selected metal materials in a vacuum melting manner so that the metals become a molten state; and S100, making metal powder: atomizing, cooling and solidifying the metals in the molten state to form fine clean metal powder.

7. The method for preparing a metal foil suitable for making a metal mask according to claim 6, wherein in step S99, a number of pure metal raw materials with a purity more than 99% and an oxygen content less than 2000 ppm or an oxygen content less than 200 ppm are selected and put into a vacuum melting furnace for melting after composition proportioning at a temperature ranging from 350° C. to 1700° C., a vacuum degree ranging from 0.01 to $10^4$ Pa or from $10^{-4}$ to 100 mbar, and a melting power of 200 to 1200 KW.

8. The method for preparing a metal foil suitable for making a metal mask according to claim 3, wherein in step S101, the raw metal coarse foil is formed by a method comprising the following steps:

S1014, metal melting: sorting and cleaning metal raw materials obtained from rough melting or recovered metal raw materials, then proportioning and adjusting the metal raw materials according to components of an alloy to be melted, adding a reducing agent to perform metal melting, and pouring a resulting molten metal into a casting mold to solidify the metal into an ingot;

S1015, refining: refining the ingot to form a metal ingot;

S1016, hot forging: performing high-temperature forging on the refined metal ingot so as to forge a large cylindrical metal ingot into a square metal block;

S1017, hot rolling: performing surface treatment on the hot forged metal block, and performing continuous hot rolling to make the metal block into metal sheets in millimeters to centimeters in thickness;

S1018, primary heat treatment: performing heat treatment at least once on the hot-rolled metal sheets to adjust microstructure and stress;

S1019, cold rolling: performing surface treatment on the metal sheets, removing surface oxide layers and washing the metal sheets, and performing cold rolling treatment at least once on the washed metal sheets; and S1020, secondary heat treatment: performing heat treatment at least once on the cold rolled metal sheets to adjust the microstructure and internal stress so as to form the raw metal coarse foil, and proceeding to step S102.

9. The method for preparing a metal foil suitable for making a metal mask according to claim 3, wherein in step S101, the raw metal coarse foil is formed by a method comprising the following steps:

S1021, cleaning a metal substrate: using a chemical cleaning agent to remove residues, contaminants, organic substances and an oxide layer from a surface of a stainless-steel substrate, washing the substrate with water after completion of the removal, and further air-drying the metal substrate after the washing with water;

S1022, pretreatment of the metal substrate: soaking the surface of the metal substrate with a high-concentration acid solution, washing with water after completion of the soaking, and further air-drying the metal substrate after the washing with water;

S1023, precision electroforming: connecting the metal substrate to a negative electrode, and then putting the metal substrate into an electroforming tank for electroforming so as to form a metal coarse foil substrate;

S1024, washing the metal coarse foil substrate: washing off an electrolyte on the metal coarse foil substrate formed by the electroforming with water, and air-drying the substrate after completion of the washing;

S1025, primary heat treatment: placing the cleaned metal coarse foil substrate in a heat treatment environment to adjust a crystalline phase microstructure and relieve an internal stress; and S1026, peeling off the metal substrate: after the primary heat treatment, mechanically peeling off the metal coarse foil substrate from the metal substrate to form the raw metal coarse foil, and proceeding to step S102.

10. The method for preparing a metal foil suitable for making a metal mask according to claim 9, wherein:

in step S1025, the primary heat treatment is selected from at least one of annealing, stress relief and material stabilizing aging treatment, the heat treatment atmosphere is selected from the dry inert atmosphere or the reducing atmosphere or the vacuum environment, the preset temperature ranges from 300° C. to 700° C., and the preset time is 2 seconds to 2 hours; and in step S103, the final heat treatment is selected from at least one of annealing, stress relief and material stabilizing aging treatment, the heat treatment atmosphere is selected from the dry inert atmosphere or the reducing atmosphere or the vacuum environment, the preset temperature ranges from 300±5° C. to 775±25° C., and the preset time is 2 seconds to 1 hours.

11. The method for preparing a metal foil suitable for making a metal mask according to claim 1, wherein a invar alloy metal foil is prepared, and a part of the invar alloy metal foil is cut out to perform flatness detection, residual stress detection and crystalline phase structure detection;

the flatness detection shows that an average three-dimensional flatness (HSR) of the edge waviness region on both sides of the invar alloy metal foil is less than 1.5%, and the average three-dimensional flatness (HSR) of a central region thereof is less than 1%;

the residual stress detection shows that the residual stress of the invar metal foil is less than or equal to 200 MPa; and the crystalline phase structure detection shows that a grain direction of a grain structure of the invar metal foil is concentrated in three directions (200), (220) and (311), and a volume fraction of grains in the main grain direction in the metal foil is between 5% and 50% respectively.

* * * * *